US012588395B2

(12) United States Patent
Zhang et al.

(10) Patent No.: US 12,588,395 B2
(45) Date of Patent: Mar. 24, 2026

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Ziyu Zhang, Beijing (CN); Tao Wang, Beijing (CN); Tao Sun, Beijing (CN); Youwei Wang, Beijing (CN); Rui Hong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 677 days.

(21) Appl. No.: 17/787,601

(22) PCT Filed: Aug. 23, 2021

(86) PCT No.: PCT/CN2021/114138
§ 371 (c)(1),
(2) Date: Jun. 21, 2022

(87) PCT Pub. No.: WO2023/023908
PCT Pub. Date: Mar. 2, 2023

(65) Prior Publication Data
US 2024/0188391 A1 Jun. 6, 2024

(51) Int. Cl.
*H10K 59/80* (2023.01)
*H10K 59/122* (2023.01)

(52) U.S. Cl.
CPC ....... *H10K 59/8731* (2023.02); *H10K 59/122* (2023.02)

(58) Field of Classification Search
CPC .... H01L 21/77; H10K 50/844; H10K 59/122; H10K 59/124; H10K 59/8731
See application file for complete search history.

(56) References Cited

U.S. PATENT DOCUMENTS

2024/0276759 A1* 8/2024 Lee ...................... H10K 59/131

FOREIGN PATENT DOCUMENTS

| CN | 110265469 A | 9/2019 |
| CN | 111564482 A | 8/2020 |
| CN | 113241422 A | 8/2021 |

* cited by examiner

*Primary Examiner* — Tony Tran
(74) *Attorney, Agent, or Firm* — Ling Wu; Stephen Yang; Ling and Yang Intellectual Property

(57) ABSTRACT
The present disclosure provides a display substrate and preparation method thereof, and a display apparatus. The display substrate includes a display region, and the display region includes at least one pin area, in a plane perpendicular to the display substrate, the pin area includes a planarization layer disposed on a base substrate, a partition layer disposed on a side of the planarization layer away from the base substrate, and an encapsulation structure layer disposed on a side of the partition layer away from the base substrate; a pin structure is provided on the planarization layer and the partition layer, and the encapsulation structure layer covers the pin structure.

7 Claims, 18 Drawing Sheets

DISPLAY SUBSTRATE AND PREPARATION METHOD THEREOF, AND DISPLAY APPARATUS

CROSS-REFERENCE TO RELATED APPLICATION

The present application is a U.S. National Phase Entry of International Application No. PCT/CN2021/114138 having an international filing date of Aug. 23, 2021. The entire contents of the above-identified application are hereby incorporated by reference.

TECHNICAL FIELD

The present disclosure relates to, but is not limited to, the field of display technologies, and in particular to a display substrate and preparation method thereof, and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, an extremely high response speed, lightness and thinness, flexibility, and low costs, etc. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the protection scope of claims.

In one aspect, the present disclosure provides a display substrate including a display region, wherein the display region includes at least one pin area. In a plane perpendicular to the display substrate, the pin area includes a planarization layer disposed on a base substrate, a partition layer disposed on a side of the planarization layer away from the base substrate, and an encapsulation structure layer disposed on a side of the partition layer away from the base substrate. A pin structure is provided on the planarization layer and the partition layer, and the encapsulation structure layer covers the pin structure.

In an exemplary implementation mode, a partition groove is provided on the planarization layer, and a partition hole is provided on the planarization layer, the partition groove is communicated with the partition hole. The partition layer located at a periphery of the partition hole has a protruding part relative to a side wall of the partition groove, the protruding part and the side wall of the partition groove form an inwardly recessed structure, and the encapsulation structure layer covers the protruding part, and the side wall and a groove bottom of the partition groove.

In an exemplary implementation mode, the pin area further includes a pixel definition layer disposed on the side of the partition layer away from the base substrate, the pixel definition layer covers an edge of the partition layer away from the partition hole, the pixel definition layer is provided with a partition opening that exposes the partition hole and the partition groove, and the encapsulation structure layer covers the partition opening.

In an exemplary implementation mode, the pin area further includes: an organic light emitting layer disposed on the side of the partition layer away from the base substrate, a cathode disposed on a side of the organic light emitting layer away from the base substrate, an organic light emitting block disposed at the groove bottom of the partition groove and a cathode block disposed on a side of the organic light emitting block away from the base substrate, the organic light emitting layer and the organic light emitting block are disposed to be isolated from each other, the cathode and the cathode block are disposed to be isolated from each other, and the encapsulation structure layer covers the cathode on the partition layer and the cathode block at the groove bottom of the partition groove.

In an exemplary implementation mode, the encapsulation structure layer includes a first encapsulation layer of an inorganic material, a second encapsulation layer of an organic material, and a third encapsulation layer of an inorganic material, the first encapsulation layer covers the protruding part and the side wall and the groove bottom of the partition groove, the second encapsulation layer is disposed on a side of the first encapsulation layer away from the base substrate and fills the partition groove, and the third encapsulation layer is disposed on a side of the second encapsulation layer away from the base substrate.

In an exemplary implementation mode, the planarization layer includes a first planarization layer, the partition layer is disposed on a side of the first planarization layer away from the base substrate, and the partition groove is provided on the first planarization layer.

In an exemplary implementation mode, the planarization layer includes a first planarization layer and a second planarization layer disposed on a side of the first planarization layer away from the base substrate, the partition layer is disposed on a side of the second planarization layer away from the base substrate, and the partition groove is provided on the second planarization layer.

In an exemplary implementation mode, the display region includes multiple pixel units and the pin area is disposed between adjacent pixel units.

In an exemplary implementation mode, at least one of the pixel units includes multiple sub-pixels sequentially disposed along a first direction, the pin area is disposed between adjacent pixel units in a second direction, and the first direction intersects with the second direction.

In an exemplary implementation mode, at least one of the pixel units includes a first sub-pixel, a second sub-pixel, a third sub-pixel, and a fourth sub-pixel, the pin area is provided at any one or more of following positions: a side of the first sub-pixel in the second direction, a side of the second sub-pixel in the second direction, a side of the third sub-pixel in the second direction, and a side of the fourth sub-pixel in the second direction.

In an exemplary implementation mode, on a plane parallel to the display substrate, a shape of the partition groove includes any one or more of following: a square, a rectangle, a pentagon, a hexagon, a circle, an ellipse, a polyline, an arc, a "T"-shape, an "L"-shape, and an "H"-shape.

In an exemplary implementation mode, the display substrate further includes a bezel region located on at least one side of the display region, the bezel region includes an isolation dam area and a crack dam area disposed sequentially along a direction away from the display region; in a plane perpendicular to the base substrate, the isolation dam area includes a composite insulation layer disposed on the base substrate, a power supply line disposed on a side of the composite insulation layer away from the base substrate, a first connection electrode disposed on a side of the power supply line away from the base substrate, a second connection electrode disposed on a side of the first connection electrode away from the base substrate, and a first isolation dam and a second isolation dam which are disposed on a side of the second connection electrode away from the base substrate, the second isolation dam is disposed on a side of the first isolation dam away from the display region; the crack dam area includes the composite insulation layer disposed on the base substrate and a crack dam disposed on a side of the composite insulation layer away from the base substrate, multiple cracks are provided on the composite insulation layer, and the crack dam fills the multiple cracks.

In an exemplary implementation mode, an edge of a side of the power supply line away from the display region, an edge of a side of the first connection electrode away from the display region, and an edge of a side of the second connection electrode away from the display region are covered by the first isolation dam and/or the second isolation dam and are not in contact with the encapsulation structure layer.

In an exemplary implementation mode, the edge of the side of the power supply line away from the display region is covered by the crack dam, or is covered by a first dam foundation in the second isolation dam, or is covered by a second dam foundation in the second isolation dam, or is covered by the first connection electrode.

In an exemplary implementation mode, the edge of the side of the first connection electrode away from the display region is covered by the crack dam, or is covered by a second dam foundation in the second isolation dam, or is covered by the second connection electrode.

In an exemplary implementation mode, the edge of the side of the second connection electrode away from the display region is covered by a third dam foundation in the second isolation dam, or is covered by the first isolation dam.

In an exemplary implementation mode, the second isolation dam includes a first dam foundation, a second dam foundation, and a third dam foundation, and the power supply line, the first connection electrode, and the second connection electrode are located in the isolation dam area; the first dam foundation is disposed on a side of the composite insulation layer away from the base substrate and covers the edge of the side of the power supply line away from the display region; the first connection electrode is disposed on a side of the power supply line away from the base substrate; the second dam foundation is disposed on the side of the power supply line away from the base substrate and covers the edge of the side of the first connection electrode away from the display region, and an orthographic projection of the second dam foundation on the base substrate is not overlapped with an orthographic projection of the first dam foundation on the base substrate; a side of the second connection electrode close to the display region is lapped on the side of the first connection electrode away from the base substrate, and the side of the second connection electrode away from the display region is lapped on a side of the second dam foundation away from the base substrate; the third dam foundation is disposed on a side of the first dam foundation and the second dam foundation away from the base substrate and covers the edge of the side of the second connection electrode away from the display region.

In an exemplary implementation mode, the second isolation dam includes a second dam foundation and a third dam foundation, and the power supply line is located in the isolation dam area and the crack dam area, the first connection electrode and the second connection electrode are located in the isolation dam area; the crack dam covers the edge of the side of the power supply line away from the display region; the first connection electrode is disposed on the side of the power supply line away from the base substrate; the second dam foundation is disposed on the side of the power supply line away from the base substrate and covers the edge of the side of the first connection electrode away from the display region; a side of the second connection electrode close to the display region is lapped on the side of the first connection electrode away from the base substrate, and the side of the second connection electrode away from the display region is lapped on a side of the second dam foundation away from the base substrate; the third dam foundation is disposed on the side of the second dam foundation away from the base substrate and covers the edge of the side of the second connection electrode away from the display region.

In an exemplary implementation mode, the second isolation dam includes a third dam foundation, the power supply line and the first connection electrode are located in the isolation dam area and the crack dam area, and the second connection electrode is located in the isolation dam area; the crack dam covers the edge of the side of the power supply line away from the display region and the edge of the side of the first connection electrode away from the display region; the second connection electrode is lapped on the side of the first connection electrode away from the base substrate, and the third dam foundation is disposed on the side of the first connection electrode away from the base substrate and covers the edge of the side of the second connection electrode away from the display region.

In an exemplary implementation mode, the second isolation dam at least includes a first dam foundation and a second dam foundation, and the power supply line, the first connection electrode, and the second connection electrode are located in the isolation dam area; the first dam foundation is disposed on the side of the composite insulation layer away from the base substrate and covers the edge of the side of the power supply line away from the display region; a side of the first connection electrode close to the display region is lapped on the side of the power supply line away from the base substrate, and the side of the first connection electrode away from the display region is lapped on a side of the first dam foundation away from the base substrate; the second dam foundation is disposed on the side of the first dam foundation away from the base substrate and covers the edge of the side of the first connection electrode away from the display region; the second connection electrode is lapped on the side of the first connection electrode away from the base substrate, and the first isolation dam is disposed on the side of the first connection electrode away from the base substrate, and the first isolation dam covers the edge of the side of the second connection electrode away from the display region.

In an exemplary implementation mode, the second isolation dam includes a second dam foundation and a third dam foundation, and the power supply line, the first connection electrode, and the second connection electrode are located in the isolation dam area; a side of the first connection electrode close to the display region is lapped on the side of the power supply line away from the base substrate, the side of the first connection electrode away from the display region is lapped on the side of the composite insulation layer away from the base substrate, and the edge of the side of the power supply line away from the display region is covered by the first connection electrode; the second dam foundation is disposed on the side of the composite insulation layer away from the base substrate and covers the edge of the side of the first connection electrode away from the display region; a side of the second connection electrode close to the display region is lapped on the side of the first connection electrode away from the base substrate, and the side of the second connection electrode away from the display region is lapped on a side of the second dam foundation away from the base substrate; the third dam foundation is disposed on the side of the second dam foundation away from the base substrate and covers the edge of the side of the second connection elec- trode away from the display region.

In an exemplary implementation mode, an orthographic projection of the edge of the side of the power supply line away from the display region on the base substrate is within a range of an orthographic projection of the first isolation dam on the base substrate.

In an exemplary implementation mode, the second isola- tion dam includes a first dam foundation and a third dam foundation, and the power supply line, the first connection electrode, and the second connection electrode are located in the isolation dam area; the first connection electrode is lapped on the side of the power supply line away from the base substrate; the first dam foundation is disposed on the side of the composite insulation layer away from the base substrate and covers the edge of the side of the power supply line away from the display region; a first side of the second connection electrode close to the display region is lapped on the side of the first connection electrode away from the base substrate, a second side of the second connection electrode away from the display region is lapped on a side of the first dam foundation away from the base substrate, a region between the first side and the second side is lapped on the side of the power supply line away from the base substrate, and the second connection electrode covers the edge of the side of the first connection electrode away from the display region; the third dam foundation is disposed on the side of the first dam foundation away from the base substrate and covers the edge of the side of the second connection elec- trode away from the display region.

In an exemplary implementation mode, an orthographic projection of the edge of the side of the first connection electrode away from the display region on the base substrate is within the range of the orthographic projection of the first isolation dam on the base substrate.

In an exemplary implementation mode, a first dam foun- dation in the second isolation dam is disposed in a same layer as a first planarization layer, a second dam foundation in the second isolation dam is disposed in a same layer as a second planarization layer, a third dam foundation in the second isolation dam is disposed in a same layer as a pixel definition layer, and the first isolation dam is disposed in a same layer as the pixel definition layer.

In another aspect, the present disclosure further provides a display apparatus, including the aforementioned display substrate.

In yet another aspect, the present disclosure further pro- vides a preparation method of a display substrate, wherein the display substrate includes a display region, and the display region includes at least one pin area, and the method includes: forming a planarization layer and a partition layer disposed on the planarization layer sequentially on a base substrate, wherein a pin structure is provided on the planarization layer and the partition layer; and forming an encap- sulation structure layer, wherein the encapsulation structure layer covers the pin structure.

Other aspects may be understood upon reading and under- standing of drawings and detailed description.

BRIEF DESCRIPTION OF DRAWINGS

Accompanying drawings are intended to provide further understanding of technical solutions of the present disclo- sure and form a portion of the specification, and are intended to explain the technical solutions of the present disclosure together with embodiments of the present application and do not constitute a limitation on the technical solutions of the present disclosure. Shapes and sizes of various components in the drawings do not reflect actual scales, and are only intended to schematically illustrate contents of the present disclosure.

Figure 1:
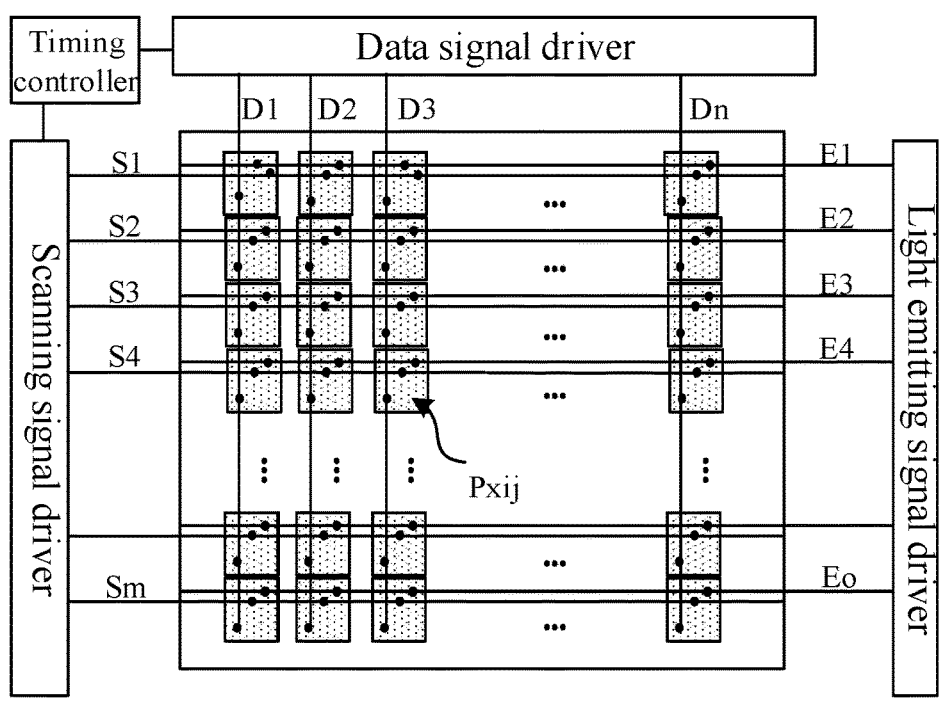
FIG. 1 is a schematic diagram of a structure of a display apparatus.

Description of reference signs is as follows.

formed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to conventional designs.

Scales of the drawings in the present disclosure may be used as references in actual processes, but are not limited thereto. For example, a width-length ratio of a channel, a thickness and spacing of each film layer, and a width and spacing of each signal line may be adjusted according to actual needs. A quantity of pixels in a display substrate and a quantity of sub-pixels in each pixel are not limited to quantities shown in the drawings. The drawings described in the present disclosure are schematic structural diagrams only, and one mode of the present disclosure is not limited to shapes, numerical values, or the like shown in the drawings.

Ordinal numerals such as "first", "second", and "third" in the specification are set to avoid confusion between constituent elements, but not to set a limit in quantity.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the

| | | |
|---|---|---|
| 1-glass carrier plate; | 10-base substrate; | 11-first insulation layer; |
| 13-second insulation layer; | 13-third insulation layer; | 14-fourth insulation layer; |
| 15-first planarization layer; | 16-second planarization layer; | 21-anode; |
| 22-pixel definition layer; | 23-organic light emitting layer; | 23-1-organic light emitting block; |
| 24-cathode; | 24-1-cathode block; | 25-post spacer; |
| 31-first encapsulation layer; | 32-second encapsulation layer; | 33-third encapsulation layer; |
| 50-power supply line; | 51-first connection electrode; | 52-second connection electrode; |
| 60-partition layer; | 61-partition hole; | 62-partition groove; |
| 100-display region; | 101-first transistor; | 102-first storage capacitor; |
| 103-signal lead; | 104-anode connection electrode; | 110-pixel area; |
| 120-pin area; | 200-bonding region; | 201-second transistor; |
| 202-second storage capacitor; | 211-first fan-out area; | 212-bending area; |
| 213-second fan-out area; | 214-anti-static area; | 215-drive chip area; |
| 216-bonding pin area; | 300-bezel region; | 301-circuit area; |
| 302-isolation dam area; | 303-crack dam area; | 400-crack dam; |
| 401-first dam foundation; | 402-second dam foundation; | 403-third dam foundation; |
| 410-first isolation dam; | 420-second isolation dam; | 501-driving structure layer; |
| 502-light emitting structure layer; | 503-encapsulation structure layer. | |

DETAILED DESCRIPTION

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that modes and contents may be transdescription, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to a direction according to which the constituent elements are described. Therefore, appropriate replacements may be made according to a situation without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand specific meanings of these terms in the present disclosure according to a specific situation.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In a case that transistors with opposite polarities are used, a direction of a current is changed during operation of a circuit, or the like, functions of the "source electrode" and the "drain electrode" are sometimes interchangeable. Therefore, the "source electrode" and the "drain electrode" are interchangeable in the specification.

In the specification, an "electrical connection" includes a case that constituent elements are connected together through an element having some electrical function. The "element having some electrical function" is not particularly limited as long as electrical signals may be sent and received between the connected constituent elements. Examples of the "element having some electrical function" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, or hexagon, etc. in this specification is not strictly defined, but may be an approximate triangle, rectangle, trapezoid, pentagon, or hexagon, etc. There may be some small deformations caused by tolerances, and there may be a guide angle, an arc edge, and deformation, etc.

In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver respectively. The data driver is connected with multiple data signal lines (D1 to Dn) respectively. The scan driver is connected with multiple scanning signal lines (S1 to Sm) respectively. The light emitting driver is connected with multiple light emitting signal lines (E1 to Eo) respectively. The pixel array may include multiple sub-pixels Pxij, wherein i and j may be natural numbers. At least one sub-pixel Pxij may include a circuit unit and a light emitting device connected with the circuit unit, and the circuit unit may include at least one scanning signal line, at least one data signal line, at least one light emitting signal line, and a pixel drive circuit. In an exemplary implementation mode, the timing controller may provide the data driver with a gray-scale value and a control signal which are suitable for a specification of the data driver, provide the scan driver with a clock signal, a scan start signal, etc., which are suitable for a specification of the scan driver, and provide the light emitting driver with a clock signal, an emission stop signal, etc., which are suitable for a specification of the light emitting driver. The data driver may generate a data voltage to be provided to the data signal lines D1, D2, D3, . . . , and Dn using the gray-scale value and the control signal that are received from the timing controller. For example, the data driver may sample the gray-scale value using the clock signal and apply a data voltage corresponding to the gray-scale value to the data signal lines D1 to Dn by taking a pixel row as a unit, wherein n may be a natural number. The scan driver may receive the clock signal, the scan starting signal, etc., from the timing controller to generate a scanning signal to be provided to the scanning signal lines S1, S2, S3, . . . , and Sm. For example, the scan driver may provide a scanning signal with an on-level pulse to the scanning signal lines S1 to Sm sequentially. For example, the scan driver may be constructed in a form of a shift register and may generate a scanning signal in a manner of sequentially transmitting the scan start signal provided in a form of an on-level pulse to a next-stage circuit under control of the clock signal, wherein m may be a natural number. The light emitting driver may receive the clock signal, the emission stop signal, etc., from the timing controller to generate an emission signal to be provided to the light emitting signal lines E1, E2, E3, . . . , and Eo. For example, the light emitting driver may provide sequentially an emission signal with an off-level pulse to the light emitting signal lines E1 to Eo. For example, the light emitting driver may be constructed in a form of a shift register and may generate an emission signal in a manner of transmitting sequentially the emission stop signal provided in a form of an off-level pulse to a next-stage circuit under control of the clock signal, wherein o may be a natural number.

Figure 2:
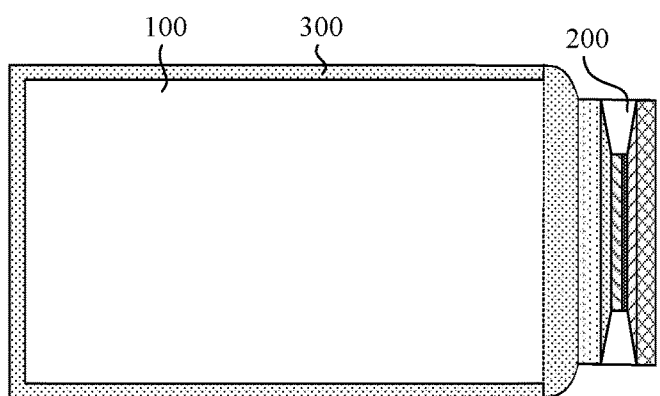
FIG. 2 is a schematic diagram of a structure of a display substrate.

FIG. 2 is a schematic diagram of a structure of a display substrate. As shown in FIG. 2, the display substrate includes a display region 100 and a non-display region located at a periphery of the display region 100. The non-display region may include a bonding region 200 located on a side of the display region 100 and a bezel region 300 located on other sides of the display region 100. In an exemplary implementation mode, the display region 100 may include multiple sub-pixels arranged in a matrix. A sub-pixel may include a pixel drive circuit and a light emitting device. The bonding region 200 may at least include an isolation dam and a bonding circuit that connects signal lines of multiple sub-pixels to an external driving apparatus. The bezel region 300 may include at least an isolation dam, a Gate Driver on Array (GOA), and a power supply line for transmitting voltage signals to the multiple sub-pixels. The bonding region 200 and the isolation dam of the bezel region 300 form an annular structure surrounding the display region 100.

Figure 3:
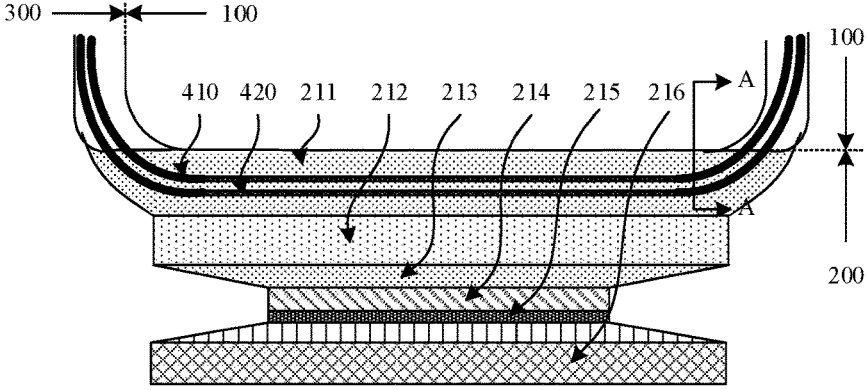
FIG. 3 is a schematic diagram of a structure of a bonding region and a bezel region in a display substrate.

FIG. 3 is a schematic diagram of a planar structure of a bonding region and a bezel region in a display substrate. As shown in FIG. 3, in an exemplary implementation mode, in a plane parallel to the display substrate, the bonding region 200 may be located on one side of a display region 100. The bonding region 200 may include a first fan-out area 211, a bending area 212, a second fan-out area 213, an anti-static area 214, a drive chip area 215, and a bonding pin area 216 that are arranged in sequence along a direction away from the display region 100. Among them, the first fan-out area 211 may at least include multiple data connection lines, multiple touch leads, a first power supply line, and a second power supply line. The multiple data connection lines are configured to be connected with data lines of the display region 100 in a fan-out trace manner. The multiple touch leads are configured to be connected with touch electrodes of the display region 100. The first power supply line is configured to be connected with a high voltage power supply line (VDD) of the display region 100, and the second power supply line is configured to be connected with a low voltage power supply line (VSS) of the bezel region 300. The bending area 212 may include a composite insulation layer provided with a groove, and is configured to bend the bonding region 200 to a back of the display region 100. The second fan-out region 213 may include multiple data connection lines that are led out in a fan-out trace manner. The anti-static area 214 may include an anti-static circuit, and is configured to prevent electrostatic damage to the display substrate by eliminating electrostatic. The drive chip area 215 may include an Integrated Circuit (IC), and is configured to be connected with multiple data connection lines. The bonding pin area 216 may include multiple bonding pads, and is configured to be bonded to and connected with an external Flexible Printed Circuit (FPC).

In an exemplary implementation mode, at least parts of the first isolation dam 410 and the second isolation dam 420 may be disposed in the first fan-out area 211. The first isolation dam 410 and the second isolation dam 420 may extend along a direction parallel to an edge of the display region, wherein a distance between the first isolation dam 410 and the edge of the display region is smaller than a distance between the second isolation dam 420 and the edge of the display region 110, and the first isolation dam 410 and the second isolation dam 420 are configured to block an organic layer in an encapsulation layer to prevent the organic layer from flowing to the bending area.

In an exemplary implementation mode, in a plane parallel to the display substrate, the bezel region 300 may include a circuit area, an isolation dam area, and a crack dam area which are sequentially disposed along a direction away from the display region 100. Among them, the circuit area may at least include a GOA which is connected with a first scan line and a second scan line of a pixel drive circuit in the display region 100. The isolation dam area may at least include the second power supply line, the first isolation dam 410, and the second isolation dam 420. The second power supply line may extend along a direction parallel to the edge of the display region, and is connected with the second power supply line VSS of the pixel drive circuit in the display region 100. The first isolation dam 410 and the second isolation dam 420 extend along the direction parallel to the edge of the display region. The first isolation dam 410 and the second isolation dam 420 of the bezel region 300 are integrally constructed with the first isolation dam 410 and the second isolation dam 420 of the bonding region 200 and are prepared synchronously through a same patterning process to form an annular structure surrounding the display region 100. The crack dam area includes multiple cracks provided on the composite insulation layer, wherein the multiple cracks are configured to reduce forces on the display region 100 and the circuit area during a cutting process, and cut off transmission of cracks to a direction of the display region 100 and the circuit area, so as to avoid affecting film layer structures of the display region 100 and the circuit area.

Figure 4:
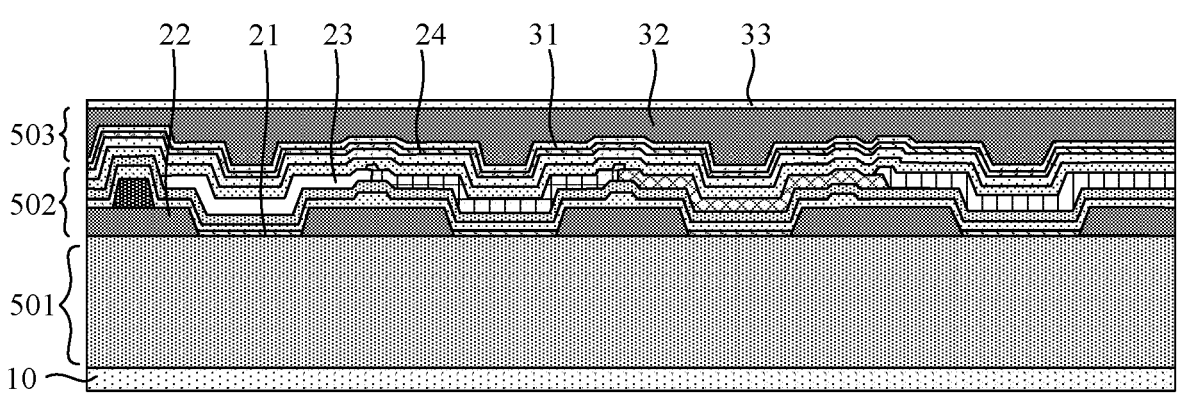
FIG. 4 is a schematic diagram of a cross-sectional struc- ture of a display region in a display substrate.

FIG. 4 is a schematic diagram of a cross-sectional structure of a display region in a display substrate, illustrating a structure of four sub-pixels of the display region. As shown in FIG. 4, in a plane perpendicular to the display substrate, each sub-pixel in the display region may include a driving structure layer 501 disposed on a base substrate 10, a light emitting structure layer 502 disposed on a side of the driving structure layer 501 away from the base substrate 10, and an encapsulation structure layer 503 disposed on a side of the light emitting structure layer 502 away from the base substrate 10.

In an exemplary implementation mode, the driving structure layer 501 of each sub-pixel may include a pixel drive circuit composed of multiple transistors and a storage capacitor. In an exemplary implementation mode, the driving structure layer 501 may include a first insulation layer disposed on the base substrate, a semiconductor layer disposed on the first insulation layer, a second insulation layer covering the semiconductor layer, a first conductive layer disposed on the second insulation layer, a third insulation layer covering the first conductive layer, a second conductive layer disposed on the third insulation layer, a fourth insulation layer covering the second conductive layer, a third conductive layer disposed on the fourth insulation layer, and a planarization layer covering the third conductive layer. Among them, the semiconductor layer may at least include multiple transistors. The first conductive layer may at least include gate electrodes of the multiple transistors and a first plate of a storage capacitor. The second conductive layer may at least include a second plate of the storage capacitor. The third conductive layer may at least include first electrodes and second electrodes of the multiple transistors.

In an exemplary implementation mode, the light emitting structure layer 502 of each sub-pixel may include a light emitting device formed by multiple film layers, wherein the multiple film layers may include an anode 21, a pixel definition layer 22, an organic light emitting layer 23, and a cathode 24. The anode 21 is connected with a pixel drive circuit. The organic light emitting layer 23 is connected with the anode 21. The cathode 24 is connected with the organic light emitting layer 23. The organic light emitting layer 23 emits light of a corresponding color under driving of the anode 21 and the cathode 24. The encapsulation structure layer 503 may include a first encapsulation layer 31, a second encapsulation layer 32, and a third encapsulation layer 33 which are stacked, wherein the first encapsulation layer 31 and the third encapsulation layer 33 may be made of an inorganic material, the second encapsulation layer 32 may be made of an organic material, and the second encapsulation layer 32 is disposed between the first encapsulation layer 31 and the third encapsulation layer 33, thus ensuring that external water vapor cannot enter the light emitting structure layer 502.

In an exemplary implementation mode, the display region may further include a touch structure layer, which may include a first conductive layer disposed on the third encapsulation layer, a touch insulation layer covering the first conductive layer, a second conductive layer disposed on the touch insulation layer, and a touch protective layer covering the second conductive layer.

Figure 5:
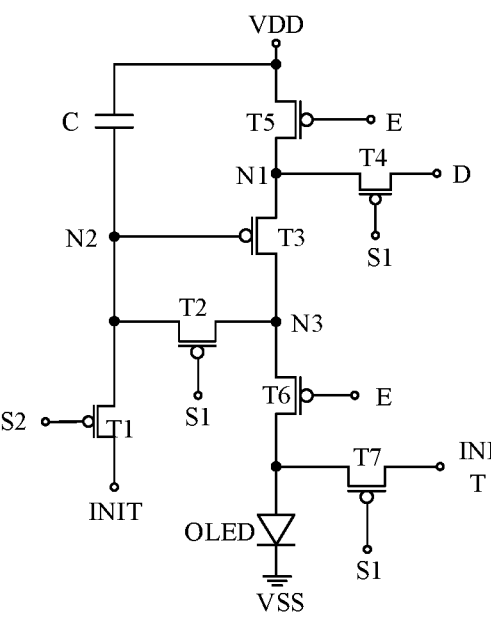
FIG. 5 is a schematic diagram of an equivalent circuit of a pixel drive circuit.

In an exemplary implementation mode, the pixel drive circuit may be in a 3T1C, 4T1C, 5T1C, 5T2C, 6T1C, or 7T1C structure. FIG. 5 is a schematic diagram of an equivalent circuit of a pixel drive circuit. As shown in FIG. 5, the pixel drive circuit may include seven transistors (a first transistor T1 to a seventh transistor T7), one storage capacitor C, and seven signal lines (a data signal line D, a first scanning signal line S1, a second scanning signal line S2, a light emitting signal line E, an initial signal line INIT, a first power supply line VDD, and a second power supply line VSS).

In an exemplary implementation mode, the pixel drive circuit may include a first node N1, a second node N2, and a third node N3. Among them, the first node N1 is connected with a first electrode of the third transistor T3, a second electrode of the fourth transistor T4, and a second electrode of the fifth transistor T5 respectively. The second node N2 is connected with a second electrode of the first transistor, a first electrode of the second transistor T2, a control electrode of the third transistor T3, and a second terminal of the storage capacitor C respectively. The third node N3 is connected with a second electrode of the second transistor T2, a second electrode of the third transistor T3, and a first electrode of the sixth transistor T6 respectively.

In an exemplary implementation mode, a first terminal of the storage capacitor C is connected with the first power supply line VDD, and the second terminal of the storage capacitor C is connected with the second node N2, namely the second terminal of the storage capacitor C is connected with the control electrode of the third transistor T3.

A control electrode of the first transistor T1 is connected with the second scanning signal line S2, a first electrode of the first transistor T1 is connected with the initial signal line INIT, and the second electrode of the first transistor is connected with the second node N2. When a scanning signal with an on-level is applied to the second scanning signal line S2, the first transistor T1 transmits an initialization voltage to the control electrode of the third transistor T3 so as to initialize a charge amount of the control electrode of the third transistor T3.

A control electrode of the second transistor T2 is connected with the first scanning signal line S1, the first electrode of the second transistor T2 is connected with the second node N2, and the second electrode of the second transistor T2 is connected with the third node N3. When a scanning signal with an on-level is applied to the first scanning signal line S1, the second transistor T2 enables the control electrode of the third transistor T3 to be connected with the second electrode of the third transistor T3.

The control electrode of the third transistor T3 is connected with the second node N2, namely the control electrode of the third transistor T3 is connected with the second terminal of the storage capacitor C, the first electrode of the third transistor T3 is connected with the first node N1, and the second electrode of the third transistor T3 is connected with the third node N3. The third transistor T3 may be referred to as a driving transistor, and the third transistor T3 determines an amount of a driving current flowing between the first power supply line VDD and the second power supply line VSS according to a potential difference between the control electrode and the first electrode of the third transistor T3.

A control electrode of the fourth transistor T4 is connected with the first scanning signal line S1, a first electrode of the fourth transistor T4 is connected with the data signal line D, and a second electrode of the fourth transistor T4 is connected with the first node N1. The fourth transistor T4 may be referred to as a switch transistor, a scan transistor, etc., and when a scanning signal with an on-level is applied to the first scanning signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power supply line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a driving current path between the first power supply line VDD and the second power supply line VSS.

A control electrode of the seventh transistor T7 is connected with the first scanning signal line S1, a first electrode of the seventh transistor T7 is connected with the initial signal line INIT, and a second electrode of the seventh transistor T7 is connected with the first electrode of the light emitting device. When a scanning signal with an on-level is applied to the first scanning signal line S1, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary implementation mode, a second electrode of the light emitting device is connected with the second power supply line VSS, a signal of the second power supply line VSS is a low-level signal, and a signal of the first power supply line VDD is a high-level signal continuously provided. The first scanning signal line S1 is a scanning signal line in a pixel drive circuit of a current display row, and the second scanning signal line S2 is a scanning signal line in a pixel drive circuit of a previous display row. That is, for an n-th display row, the first scanning signal line S1 is S(n), and the second scanning signal line S2 is S(n−1). The second scanning signal line S2 of the current display row and the first scanning signal line S1 in the pixel drive circuit of the previous display row are a same signal line, thus signal lines of the display panel may be reduced, so that a narrow bezel of the display panel is achieved.

In an exemplary implementation mode, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementation modes, the first transistor T1 to the seventh transistor T7 may include a P-type transistor and an N-type transistor.

In an exemplary implementation mode, the first scanning signal line S1, the second scanning signal line S2, the light emitting signal line E, and the initial signal line INIT extend along a horizontal direction, and the second power supply line VSS, the first power supply line VDD, and the data signal line D extend along a vertical direction.

In an exemplary implementation mode, the light emitting device may be an Organic light emitting Diode (OLED), including a first electrode (anode), an organic light emitting layer, and a second electrode (cathode) that are stacked.

Figure 6:
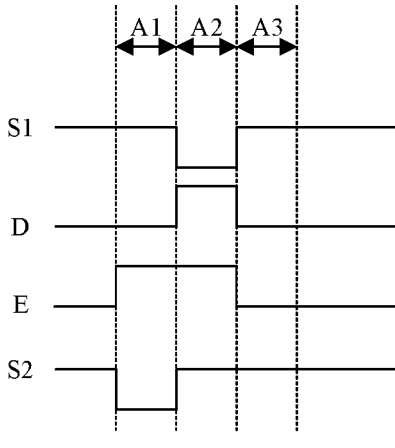
FIG. 6 is a working timing diagram of a pixel drive circuit.

FIG. 6 is a working timing diagram of a pixel drive circuit. An exemplary embodiment of the present disclosure will be described below through a working process of the pixel drive circuit shown in FIG. 5. The pixel drive circuit in FIG. 5 includes seven transistors (a first transistor T1 to a seventh transistor T7), one storage capacitor C, and seven signal lines (a data signal line D, a first scanning signal line S1, a second scanning signal line S2, a light emitting signal line E, an initial signal line INIT, a first power supply line VDD, and a second power supply line VSS), wherein all of the seven transistors are P-type transistors.

In an exemplary implementation mode, the working process of the pixel drive circuit may include following stages.

In a first stage A1, referred to as a reset stage, a signal of the second scanning signal line S2 is a low-level signal, and signals of the first scanning signal line S1 and the light emitting signal line E are high-level signals. The signal of the second scanning signal line S2 is the low-level signal, so that the first transistor T1 is turned on, and a signal of the initial signal line INIT is provided to the second node N2 to initialize the storage capacitor C to clear an original data voltage in the storage capacitor. The signals of the first scanning signal line S1 and the light emitting signal line E are high-level signals, so that the second transistor T2, the fourth transistor T4, the fifth transistor T5, the sixth transistor T6, and the seventh transistor T7 are turned off. The OLED does not emit light in this stage.

In a second stage A2, referred to as a data writing stage or a threshold compensation stage, a signal of the first scanning signal line S1 is a low-level signal, signals of the second scanning signal line S2 and the light emitting signal line E are high-level signals, and the data signal line D outputs a data voltage. In this stage, the second terminal of the storage capacitor C is at a low level, so that the third transistor T3 is turned on. The signal of the first scanning signal line S1 is the low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through the first node N1, the turned-on third transistor T3, the third node N3, and the turned-on second transistor T2, and the storage capacitor C is charged with a difference between the data voltage output by the data signal line D and a threshold voltage of the third transistor T3. A voltage of the second terminal (the second node N2) of the storage capacitor C is Vd−|Vth|, wherein Vd is the data voltage output by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light. A signal of the second scanning signal line S2 is a high-level signal, so that the first transistor T1 is turned off. A signal of the light emitting signal line E is a high-level signal, so that the fifth transistor T5 and the sixth transistor T6 are turned off.

In a third stage A3, referred to as a light emitting stage, a signal of the light emitting signal line E is a low-level signal, and signals of the first scanning signal line S1 and the second scanning signal line S2 are high-level signals. The signal of the light emitting signal line E is the low-level signal, so that the fifth transistor T5 and the sixth transistor T6 are turned on, and a power voltage output by the first power supply line VDD provides a driving voltage to the first electrode of the OLED through the turned-on fifth transistor T5, the third transistor T3, and the sixth transistor T6 to drive the OLED to emit light.

In a driving process of the pixel drive circuit, a driving current flowing through the third transistor T3 (driving transistor) is determined by a voltage difference between a gate electrode and a first electrode of the third transistor T3. A voltage of the second node N2 is Vdata-|Vth|, so that the driving current of the third transistor T3 is as follows.

$$I=K*(Vgs-Vth)^2=K*[(Vdd-Vd+|Vth|)-Vth]^2=K*[(Vdd-Vd]^2$$

I is the driving current flowing through the third transistor T3, i.e., a driving current for driving the OLED, K is a constant, Vgs is the voltage difference between the gate electrode and first electrode of the third transistor T3, Vth is the threshold voltage of the third transistor T3, Vd is the data voltage output by the data signal line D, and Vdd is the power voltage output by the first power supply line VDD.

At present, flexible OLED display apparatuses represented by folding screens have gradually entered a consumer market, but existing structures still have a problem of insufficient service life due to encapsulation failure.

Researches show that, an important reason for encapsulation failure of existing structures is that adhesion of an organic light emitting layer prepared by using an evaporation process is relatively weak, and in a process of repeated bending and long-term shear stress, peeling occurs between film layers, thus forming holes between the film layers. When a crack appears in an encapsulation layer, external water and oxygen may enter the holes through the crack and flow along a channel formed by the holes until it diffuses to a light emitting structure layer, resulting in encapsulation failure. Since the adhesion of the organic light emitting layer prepared by using the evaporation process is determined by physical characteristics, it is difficult to improve the adhesion significantly through improvement on the process. Therefore, how to improve the adhesion between an organic light emitting layer and other film layers, especially an ability to resist shear stress, has become a relatively important subject.

An exemplary embodiment of the present disclosure provides a display substrate including a display region, and the display region includes at least one pin area. In a plane perpendicular to the display substrate, the pin area includes a planarization layer disposed on a base substrate, a partition layer disposed on a side of the planarization layer away from the base substrate, and an encapsulation structure layer disposed on a side of the partition layer away from the base substrate. A pin structure is provided on the planarization layer and the partition layer, and the encapsulation structure layer covers the pin structure.

In an exemplary implementation mode, the pin structure may include a partition groove provided on a second planarization layer and a partition hole provided on the partition layer, wherein the partition hole and the partition groove communicate with each other.

In an exemplary implementation mode, a partition hole is provided on the partition layer, and a partition groove is provided on the planarization layer, wherein the partition groove is communicated with the partition hole. The partition layer located at a periphery of the partition hole has a protruding part relative to a side wall of the partition groove, wherein the protruding part and the side wall of the partition groove form an inwardly recessed structure, and the encapsulation structure layer covers the protruding part, the side wall and a groove bottom of the partition groove.

Figure 7:
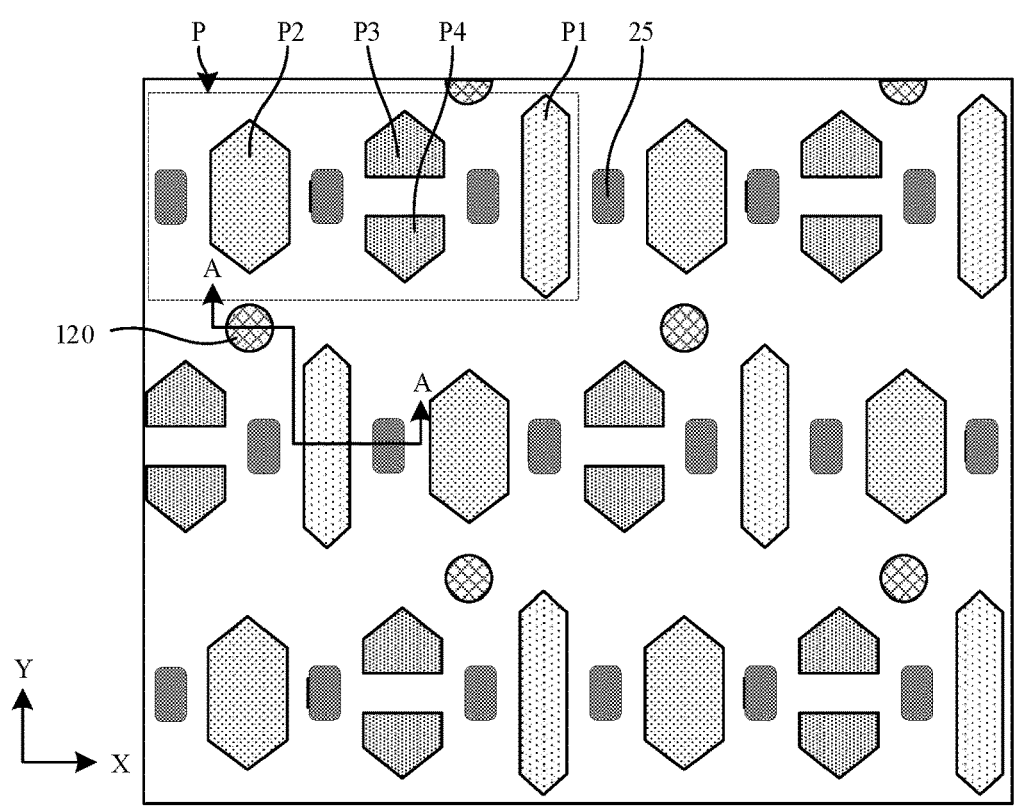
FIG. 7 is a schematic diagram of a planar structure of a display region according to an exemplary embodiment of the present disclosure.

FIG. 7 is a schematic diagram of a planar structure of a display substrate according to an exemplary embodiment of the present disclosure. As shown in FIG. 7, in an exemplary implementation mode, a display region of a display substrate may include multiple pixel units P arranged regularly. At least one of the pixel units P may include one first sub-pixel P1 emitting light of a first color, one second sub-pixel P2 emitting light of a second color, and one third sub-pixel P3 and one fourth sub-pixel P4 that emit light of a third color. Each of the four sub-pixels may include a circuit unit and a light emitting device, wherein the circuit unit may include a scanning signal line, a data signal line, a light emitting signal line and a pixel drive circuit. The pixel drive circuit is connected with the scanning signal line, the data signal line, and the light emitting signal line, respectively. The pixel drive circuit is configured to receive a data voltage transmitted by the data signal line under control of the scanning signal line and the light emitting signal line, and output a corresponding current to the light emitting device. The light emitting device in each of the sub-pixels is connected with a pixel drive circuit of a sub-pixel where the light emitting device is located, and is configured to emit light with a corresponding brightness in response to a current output by the pixel drive circuit of the sub-pixel where the light emitting device is located.

In an exemplary implementation mode, multiple pixel units sequentially disposed in a first direction X may be referred to as a pixel row, and multiple pixel units sequentially disposed in a second direction Y, a vertical direction, may be referred to as a pixel column, and multiple pixel rows and multiple pixel columns constitute a pixel array arranged in an array, wherein the first direction X and the second direction Y intersect.

In an exemplary implementation mode, the first sub-pixel PI may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary implementation mode, a shape of a sub-pixel may be a rectangle, a rhombus, a pentagon, or a hexagon, etc. In an exemplary implementation mode, the four sub-pixels may be in a shape of a pentagon or hexagon respectively, and are arranged side by side, two pentagonal G sub-pixels are located in a middle of the pixel unit, hexagonal R sub-pixel an d hexagonal B sub-pixel are respectively located on two sides of the G sub-pixels in the first direction X. In another exemplary implementation mode, the four sub-pixels may be arranged in a manner of a Square, a Diamond, a horizontal juxtaposition, or a vertical juxtaposition, etc., which are not limited in the present disclosure.

In an exemplary implementation mode, the display region may include multiple post spacers 25, wherein the multiple post spacers 25 may be respectively disposed between adjacent sub-pixels, and the post spacers may be disposed at any one or more of following positions: one side of the first sub-pixel P1 in the first direction X, one side of the second sub-pixel P2 in the first direction X, one side of the third sub-pixel P3 in the first direction X, and one side of the fourth sub-pixel P4 in the first direction X. For example, in the first direction X, the multiple post spacers 25 may be disposed between adjacent R sub-pixels and B sub-pixels, between adjacent R sub-pixels and G sub-pixels, and between adjacent B sub-pixels and G sub-pixels respectively. In an exemplary implementation mode, the post spacers 25 are configured to support a Fine Metal Mask (FMM) in an evaporation process.

In an exemplary implementation mode, the display region may include multiple pin areas 120, wherein the multiple pin areas 120 may be disposed between adjacent pixel units P, the pin areas 120 are configured to cooperate with the encapsulation layer to form pin points, thereby improving the ability of the film layers to resist shear stress and prevent peeling failure of the film layers.

In an exemplary implementation mode, at least one pixel unit may include multiple sub-pixels arranged sequentially along the first direction X, and the pin areas may be arranged between adjacent pixel units P in the second direction Y.

In an exemplary implementation mode, the multiple pin areas 120 may form multiple pin rows, wherein each pin row may include multiple pin areas 120, and the multiple pin areas 120 may be sequentially disposed along a horizontal direction. A first pin row may be disposed between a first pixel row and a second pixel row, and a second pin row may be disposed between the second pixel row and a third pixel row. Or, the first pin row may be disposed between the second pixel row and the third pixel row, the second pin row may be disposed between a fifth pixel row and a sixth pixel row, and so on, which is not limited in the present disclosure.

In an exemplary implementation mode, at least one pin area 120 may be provided at any one or more of following positions: one side of a first sub-pixel P1 (R sub-pixel) in the second direction Y, one side of a second sub-pixel P2 (B sub-pixel) in the second direction Y, one side of a third sub-pixel P3 (G sub-pixel) in the second direction Y, and one side of a fourth sub-pixel P4 (G sub-pixel) in the second direction Y, which is not limited in the present disclosure.

In an exemplary implementation mode, for a display region where no post spacer is provided, at least one pin area 120 may be provided at any one or more of following positions: one side of the first sub-pixel P1 in the first direction X, one side of the second sub-pixel P2 in the first direction X, one side of the third sub-pixel P3 in the first direction X, and one side of the fourth sub-pixel P4 in the first direction X, which is not limited in the present disclosure.

In an exemplary implementation mode, a shape of at least one pin area 120 on a plane parallel to the display substrate may include any one or more of following: a square, a rectangle, a pentagon, a hexagon, a circle, an ellipse, a polyline, an arc, a "T"-shape, an "L"-shape, and an "H"-shape, which is not limited in the present disclosure.

Figure 8:
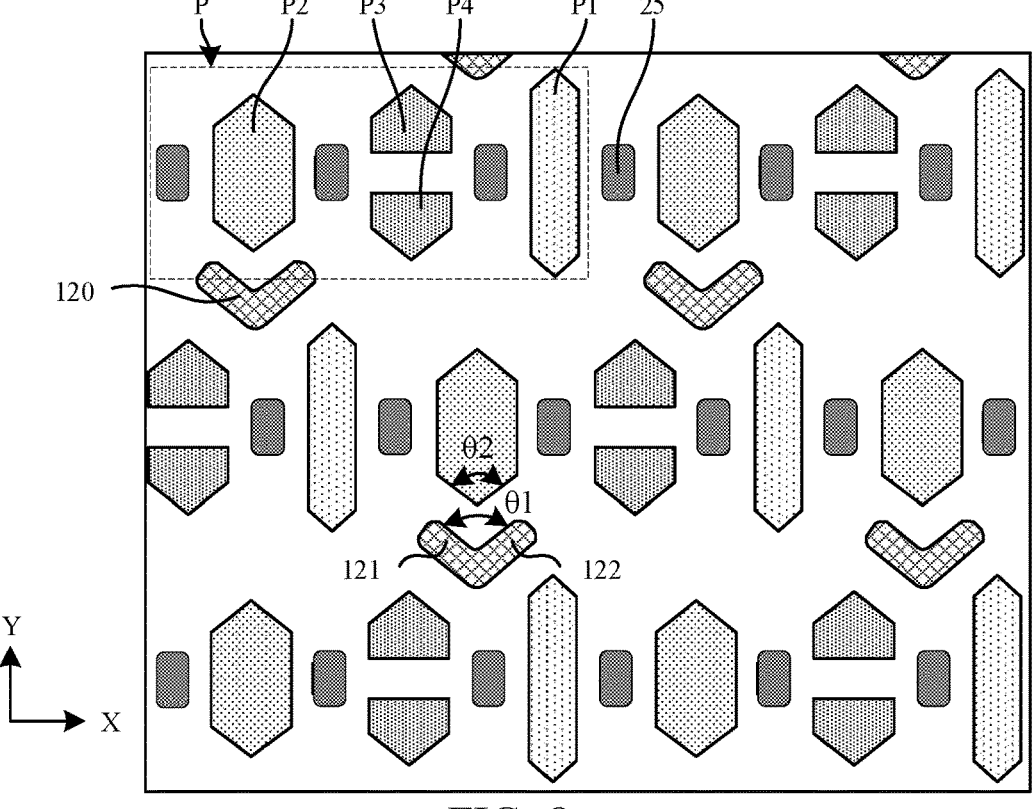
FIG. 8 is a schematic diagram of a planar structure of another display region according to an exemplary embodi- ment of the present disclosure.

FIG. 8 is a schematic diagram of a planar structure of another display region according to an exemplary embodiment of the present disclosure. As shown in FIG. 8, structures of pixel units P and post spacers 25 in the display region and a layout relationship of the pixel units P, the post spacers 25, and pin areas 120 may be the same as those shown in FIG. 7, a difference is that a shape of a pin area 120 has a polyline structure.

In an exemplary implementation mode, a first sub-pixel P1 (R sub-pixel) and a second sub-pixel P2 (B sub-pixel) may be hexagonal, wherein a length of the first sub-pixel P1 in a pixel column direction may be greater than a length of the second sub-pixel P2 in the pixel column direction, and a width of the first sub-pixel P1 in a pixel row direction may be smaller than a length of the second sub-pixel P2 in the pixel row direction. The pin area 120 with the polyline structure may include a first sub-area 121 and a second sub-area 122, ends of the first sub-area 121 and the second sub-area 122 that are close to each other are connected with each other and form a polyline structure having a first included angle θ1.

In an exemplary implementation mode, the pin area 120 with the polyline structure may be provided on one side of the second sub-pixel P2 in the pixel column direction, two sides of the second sub-pixel P2 close to one side of the pin area 120 may form a second included angle θ2, wherein the first included angle θ1 of the pin area 120 may be equal to the second included angle θ2 of the second sub-pixel P2.

In an exemplary implementation mode, the pin area 120 with the polyline structure may include multiple sub-areas connected in sequence. Extension directions of multiple sub-areas are different, forming a polyline structure with multiple bends. The polyline structure has a snake-like shape and has multiple included angles, which is not limited in the present disclosure.

In an exemplary implementation mode, the pin area 120 with the polyline structure may improve stability of a pin point.

Figure 9A:
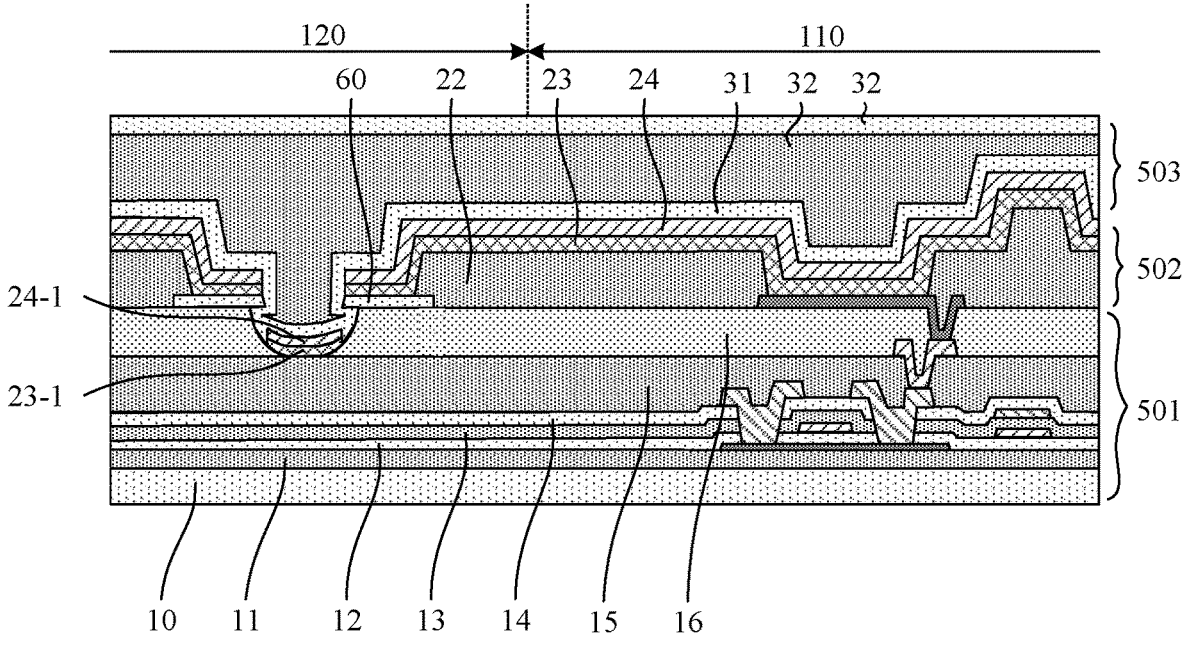
FIG. 9a is a schematic diagram of a cross-sectional structure of a display region according to an exemplary embodiment of the present disclosure.

FIG. 9a is a schematic diagram of a cross-sectional structure of a display region according to an exemplary embodiment of the present disclosure, and it is a cross-sectional view taken along a direction A-A in FIG. 7. In a plane parallel to a display substrate, the display region may include a pixel area 110 and a pin area 120. In a plane perpendicular to the display substrate, the pixel area 110 may include a driving structure layer 501 disposed on a base substrate 10, a light emitting structure layer 502 disposed on a side of the driving structure layer 501 away from the base substrate, and an encapsulation structure layer 503 disposed on a side of the light emitting structure layer 502 away from the base substrate. In an exemplary implementation mode, the pixel area 110 may include a touch structure layer disposed on a side of the encapsulation structure layer away from the base substrate, which is not limited in the present disclosure.

In an exemplary implementation mode, in a plane perpendicular to the display substrate, the pin area 120 may include a composite insulation layer disposed on the base substrate 10, a first planarization layer 15 disposed on a side of the composite insulation layer away from the base substrate, a second planarization layer 16 disposed on a side of the first planarization layer 15 away from the base substrate, a partition layer 60 disposed on a side of the second planarization layer 16 away from the base substrate 10, and an encapsulation structure layer 503 disposed on a side of the partition layer 60 away from the base substrate.

In an exemplary implementation mode, the composite insulation layer may include a first insulation layer 11, a second insulation layer 12, a third insulation layer 13, and a fourth insulation layer 14 that are stacked on the base substrate 10.

In an exemplary implementation mode, a partition hole is provided on the partition layer 60, and a partition groove is provided on the second planarization layer 16, wherein the partition groove is communicated with the partition hole. The partition layer 60 located at a periphery of the partition hole has a protruding part relative to a side wall of the partition groove, wherein the protruding part and the side wall of the partition groove form an inwardly recessed structure, and a first encapsulation layer 31 in the encapsulation structure layer 503 covers the protruding part, the side wall and a groove bottom of the partition groove.

In an exemplary implementation mode, the pin area 120 may further include a pixel definition layer 22 disposed on a side of the partition layer 60 away from the base substrate. The pixel definition layer 22 covers an edge of the partition layer 60 away from the partition hole, the pixel definition layer 22 is provided with a partition opening that exposes the partition hole and the partition groove, and the first encapsulation layer 31 in the encapsulation structure layer 503 covers the partition opening.

In an exemplary implementation mode, the pin area 120 may further include an organic light emitting layer 23 disposed on a side of the partition layer 60 away from the base substrate and a cathode 24 disposed on a side of the organic light emitting layer 23 away from the base substrate, and include an organic light emitting block 23-1 disposed at a groove bottom of the partition groove and a cathode block 24-1 disposed on a side of the organic light emitting block 23-1 away from the base substrate. The organic light emitting layer 23 is arranged to be isolated from the organic light emitting block 23-1, the cathode 24 is arranged to be isolated from the cathode block 24-1, and the first encapsulation layer 31 in the encapsulation structure layer 503 covers the cathode 24 and the organic light emitting layer 23 on the partition layer 60 and the cathode block 24-1 and the organic light emitting block 23-1 at the groove bottom of the partition groove.

In an exemplary implementation mode, the encapsulation structure layer 503 may include a first encapsulation layer 31 of an inorganic material, a second encapsulation layer 32 of an organic material, and a third encapsulation layer 33 of an inorganic material. The first encapsulation layer 31 covers the protruding part and the side wall and the groove bottom of the partition groove, the second encapsulation layer 32 is disposed on a side of the first encapsulation layer 31 away from the base substrate and fills the partition groove, and the third encapsulation layer 33 is disposed on a side of the second encapsulation layer 32 away from the base substrate.

Figure 9B:
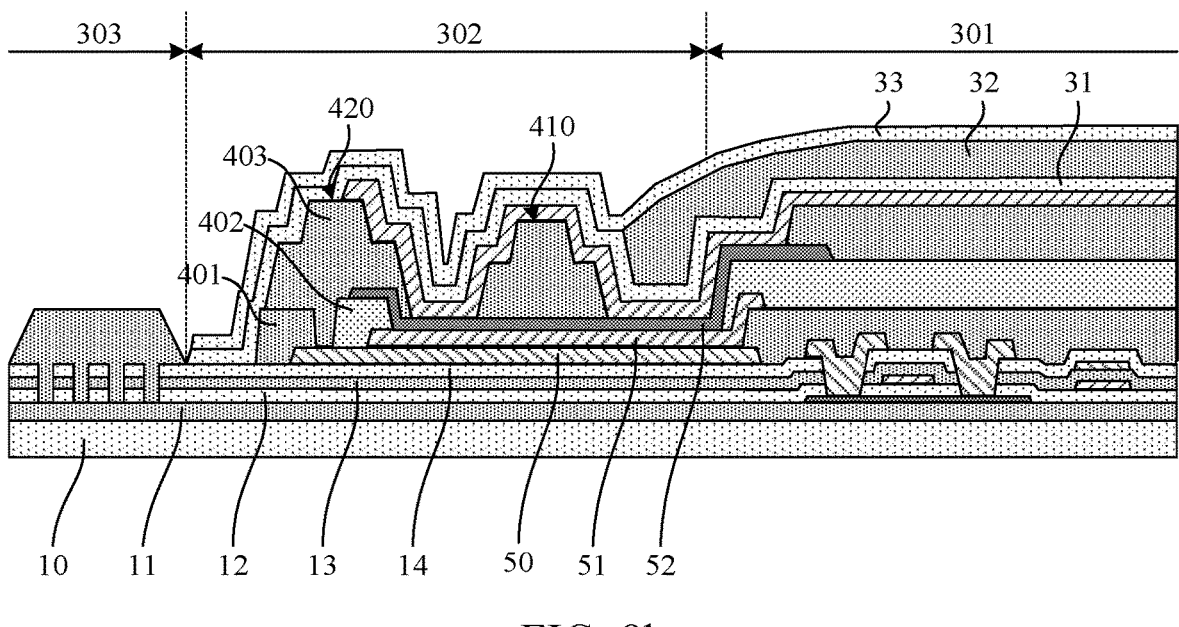
FIG. 9b is a schematic diagram of a cross-sectional structure of a bezel region according to an exemplary embodiment of the present disclosure.

FIG. 9b is a schematic diagram of a cross-sectional structure of a bezel region according to an exemplary embodiment of the present disclosure. In a plane parallel to the display substrate, the bezel region may include a circuit area 301, an isolation dam area 302, and a crack dam area 303 which are sequentially disposed along a direction away from the display region. In an exemplary implementation mode, the circuit area 301 and the isolation dam area 302 may not be overlapped or may be partially overlapped, which is not limited in the present disclosure.

In an exemplary implementation mode, in a plane perpendicular to the display substrate, the isolation dam area 302 may include a composite insulation layer disposed on the base substrate 10, a power supply line 50 disposed on a side of the composite insulation layer away from the base substrate, a first connection electrode 51 disposed on a side of the power supply line 50 away from the base substrate, a second connection electrode 52 disposed on a side of the first connection electrode 51 away from the base substrate, and a first isolation dam 410 and a second isolation dam 420 disposed on a side of the second connection electrode 52 away from the base substrate, wherein the second isolation dam 420 is disposed on a side of the first isolation dam 410 away from the display region.

In an exemplary implementation mode, the second isolation dam 420 may include a first dam foundation 401, a second dam foundation 402, and a third dam foundation 403, and at least parts of the power supply line 50, the first connection electrode 51, and the second connection electrode 52 are located in the isolation dam area 302. The first dam foundation 401 is disposed on a side of the composite insulation layer away from the base substrate and covers an edge of the power supply line 50 away from the display region. An orthographic projection of the edge of the power supply line 50 away from the display region on the base substrate is within a range of an orthographic projection of the first dam foundation 401 on the base substrate. The first connection electrode 51 is disposed on a side of the power supply line 50 away from the base substrate, and an orthographic projection of the first connection electrode 51 on the base substrate is not overlapped with the orthographic projection of the first dam foundation 401 on the base substrate.

In an exemplary implementation mode, the edge of the power supply line 50 away from the display region, an edge of the first connection electrode 51 away from the display region, and an edge of the second connection electrode 52 away from the display region may be covered by the first isolation dam 410 and/or the second isolation dam 420, without contacting the encapsulation structure layer.

In an exemplary implementation mode, the edge of the power supply line 50 away from the display region may be covered by a crack dam 400, or may be covered by the first dam foundation 401 in the second isolation dam 420, or may be covered by the second dam foundation 402 in the second isolation dam 420, or may be covered by the first connection electrode 51.

In an exemplary implementation mode, the edge of the first connection electrode 51 away from the display region is covered by the crack dam 400, or may be covered by the second dam foundation 402 in the second isolation dam 420, or may be covered by the second connection electrode 52.

In an exemplary implementation mode, the edge of the second connection electrode 52 away from the display region is covered by the third dam foundation 403 in the second isolation dam 420, or may be covered by the first isolation dam 410.

In an exemplary implementation mode, the second dam foundation 402 is dispose on a side of the power supply line 50 away from the base substrate, and covers the edge of the first connection electrode 51 away from the display region, an orthographic projection of the edge of the first connection electrode 51 away from the display region on the base substrate is within a range of an orthographic projection of the second dam foundation 402 on the base substrate, and the orthographic projection of the second dam foundation 402 on the base substrate is not overlapped with the an orthographic projection of the first dam foundation 401 on the base substrate.

In an exemplary implementation mode, a side of the second connection electrode 52 close to the display region is lapped on a side of the first connection electrode 51 away from the base substrate, a side of the second connection electrode 52 away from the display region is lapped on a side of the second dam foundation 402 away from the base substrate, wherein an orthographic projection of an edge of the second connection electrode 52 away from the display region on the base substrate is within a range of an orthographic projection of the second dam foundation 402 on the base substrate.

In an exemplary implementation mode, the third dam foundation 403 is dispose on a side of the first dam foundation 401 and the second dam foundation 402 away from the base substrate, and covers an edge of the second connection electrode 52 away from the display region. An orthographic projection of an edge of the second connection electrode 52 away from the display region on the base substrate is within a range of an orthographic projection of the third dam foundation 403 on the base substrate. The orthographic projection of the third dam foundation 403 on the base substrate is at least partially overlapped with an orthographic projection of the first dam foundation 401 on the base substrate, and the orthographic projection of the third dam foundation 403 on the base substrate is at least partially overlapped with an orthographic projection of the second dam foundation 402 on the base substrate.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, or the like. If the "thin film" does not need a patterning process in an entire preparation process, the "thin film" may also be referred to as a "layer". If the "thin film" needs the patterning process in the entire preparation process, it is referred to as a "thin film" before the patterning process, and is referred to as a "layer" after the patterning process. The "layer" after the patterning process includes at least one "pattern". "A and B being disposed in a same layer" in the present disclosure means that A and B are formed simultaneously through a single patterning process, and a "thickness" of a film layer is a dimension of the film layer in a direction perpendicular to the display substrate. In an exemplary embodiment of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary implementation mode, in a plane direction parallel to the display substrate, the display substrate may include a display region 100 and a bezel region 300 located on at least one side of the display region 100. The display region 100 may include a pixel area 110 and a pin area 120, and the bezel region 300 may include a circuit area 301, an isolation dam area 302, and a crack dam area 303. In an exemplary implementation mode, preparation of a display substrate of an exemplary embodiment of the present disclosure may include following acts.

(1) Preparing a base substrate on a glass carrier plate. In an exemplary implementation mode, the base substrate may include a first flexible material layer, a first inorganic material layer, a second flexible material layer, and a second inorganic material layer stacked on the glass carrier plate. A material of the first flexible material layer and the second flexible material layer may be Polyimide (PI), Polyethylene Terephthalate (PET), or a polymer soft film subjected to a surface treatment, etc. A material of the first inorganic material layer and the second inorganic material layer may be Silicon Nitride (SiNx) or Silicon Oxide (SiOx), etc., which are used for improving water and oxygen resistance of the base substrate. The first inorganic material layer and the second inorganic material layer may be referred to as barrier layers or buffer layers. In an exemplary implementation mode, taking a laminated structure PI 1/Barrier 1/PI 2/Barrier 2 as an example, a preparation process may include: coating a layer of polyimide on the glass carrier plate 1 first, and forming a first flexible layer (PI 1) after curing the layer of polyimide to form a film; subsequently, depositing a layer of barrier thin film on the first flexible layer to form a first barrier layer (Barrier 1) covering the first flexible layer; then coating a layer of polyimide on the first barrier layer, and forming a second flexible layer (PI 2) after curing the layer of polyimide to form a film; then depositing a layer of barrier thin film on the second flexible layer to form a second barrier layer (Barrier 2) covering the second flexible layer, so as to complete preparation of the base substrate. In some exemplary implementation modes, an amorphous Silicon (a-Si) layer may be provided between the first barrier layer and the second inorganic material layer, the base substrate may include a first flexible material layer, a first inorganic material layer, a semiconductor layer, a second flexible material layer, and a second inorganic material layer that are stacked on the glass carrier plate. In an exemplary implementation mode, in a process of forming the first barrier layer, an inorganic hole may be formed on the first barrier layer through a patterning process, and a position of the inorganic hole may correspond to a position of a via to be formed subsequently. After this process, the display region, the circuit area 301, the isolation dam area 302, and the crack dam area 303 all include the base substrate.

(2) Preparing patterns of a driving structure layer of a display region, a circuit structure layer of a circuit area, an isolation structure layer of an isolation dam area, and a crack structure layer of a crack dam area on the base substrate 10. In an exemplary implementation mode, the driving structure layer of the display region may include a first transistor 101 and a first storage capacitor 102 constituting a pixel drive circuit, a circuit structure layer of the circuit area 301 may include a second transistor 201 and a second storage capacitor 202 constituting a GOA, an isolation structure layer of the isolation dam area 302 may include a composite insulation layer disposed on the base substrate and a power supply line 50 disposed on the composite insulation layer, and a crack structure layer of the crack dam area 303 may include a composite insulation layer provided with multiple cracks. In an exemplary implementation mode, the composite insulation layer may include multiple stacked inorganic insulation layers.

In an exemplary implementation mode, a process of preparing the patterns of the driving structure layer of the display region, the circuit structure layer of the circuit area, the isolation structure layer of the isolation dam area, and the crack structure layer of the crack dam area may include: sequentially depositing a first insulation thin film and a semiconductor thin film on the base substrate 10, and patterning the semiconductor thin film through a patterning process to form a first insulation layer 11 on the base substrate 10 and a pattern of a semiconductor layer disposed on the first insulation layer 11, wherein the pattern of the semiconductor layer at least includes a first active layer located in the display region, and a second active layer located in the circuit area 301. After this process, the semiconductor thin film of the isolation dam area 302 and the crack dam area 303 are etched off, the isolation dam area 302 and the crack dam area 303 include the base substrate 10 provided on the glass carrier plate 1 and the first insulation layer 11 provided on the base substrate 10.

Subsequently, a second insulation thin film and a first conductive thin film are sequentially deposited, and the first conductive thin film is patterned through a patterning process to form a second insulation layer 12 covering the pattern of the semiconductor layer and a pattern of a first conductive layer disposed on the second insulation layer 12, wherein the pattern of the first conductive layer at least includes a first gate electrode and a first capacitor electrode which are located in the display region, and a second gate electrode and a second capacitor electrode which are located in the circuit area 301. After this process, the first conductive thin film of the isolation dam area 302 and the crack dam area 303 are etched off, the isolation dam area 302 and the crack dam area 303 include the base substrate 10, and the first insulation layer 11 and the second insulation layer 12 that are stacked on the base substrate 10.

Subsequently, a third insulation thin film and a second conductive thin film are sequentially deposited, and the second conductive thin film is patterned through a patterning process to form a third insulation layer 13 covering the pattern of the first conductive layer and a pattern of a second conductive layer disposed on the third insulation layer 13, wherein the pattern of the second conductive layer at least includes a third capacitor electrode located in the display region and a fourth capacitor electrode located in the circuit area 301, a position of the third capacitor electrode corresponds to a position of the first capacitor electrode, and a position of the fourth capacitor electrode corresponds to a position of the second capacitor electrode. After this process, the second conductive thin film of the isolation dam area 302 and the crack dam area 303 are etched off, the isolation dam area 302 and the crack dam area 303 include the base substrate 10, and the first insulation layer 11, the second insulation layer 12, and the third insulation layer 13 that are stacked on the base substrate 10.

Subsequently, a fourth insulation thin film is deposited, the fourth insulation thin film is patterned through a patterning process to form a fourth insulation layer 14 covering the pattern of the second conductive layer, and multiple vias and multiple through holes are formed on the fourth insulation layer 14. The multiple vias may include a first active via located in the display region and a second active via located in the circuit area 301, the fourth insulation layer 14, the third insulation layer 13, and the second insulation layer 12 in the first active via and the second active via are etched off, the first active via exposes a source region and a drain region at two ends of the first active layer, and the second active via exposes a source region and a drain region at two ends of the second active layer. After this process, the isolation dam area 302 and the crack dam area 303 include the base substrate 10 and the composite insulation layer disposed on the base substrate 10, and the composite insulation layer includes the first insulation layer 11, the second insulation layer 12, the third insulation layer 13, and the fourth insulation layer 14 that are stacked.

Subsequently, a third conductive thin film is deposited, the third conductive thin film is patterned through a patterning process, and a pattern of a third conductive layer is formed on the fourth insulation layer 14. The pattern of the third conductive layer at least includes a first source electrode, a first drain electrode, and a signal lead 103 located in the display region, and a second source electrode, a second drain electrode, and a power supply line 50 located in the bezel region. The first source electrode and the first drain electrode may be located in the pixel area 110 in the display region, and are connected with the first active layer through the first active via respectively and the signal lead 103 may be located in the pin area 120 in the display region. The second source electrode and the second drain electrode may be located in the circuit area 301 in the bezel region, and are respectively connected with the second active layer through the second active via, the power supply line 50 may be located in the isolation dam area 302 in the bezel region, and an edge of the power supply line 50 close to the display region may be located in the circuit area 301.

Figure 10A:
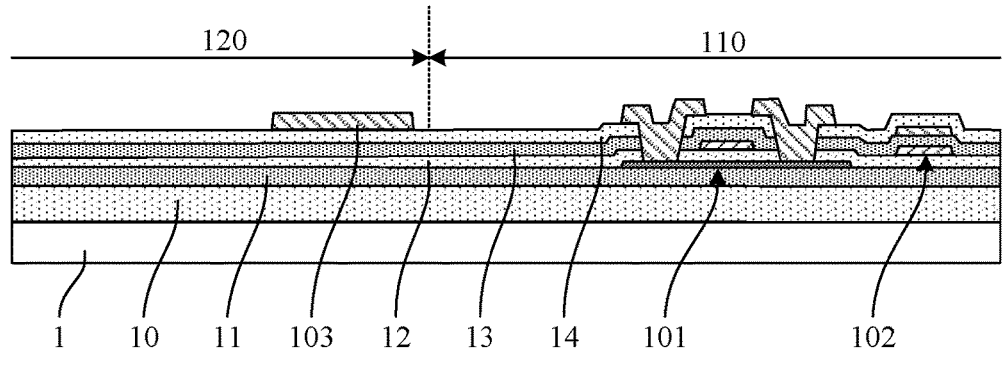
FIGS. 10a and 10b are schematic diagrams after a pattern of a driving structure layer is formed according to an exemplary embodiment of the present disclosure.
Figure 10B:
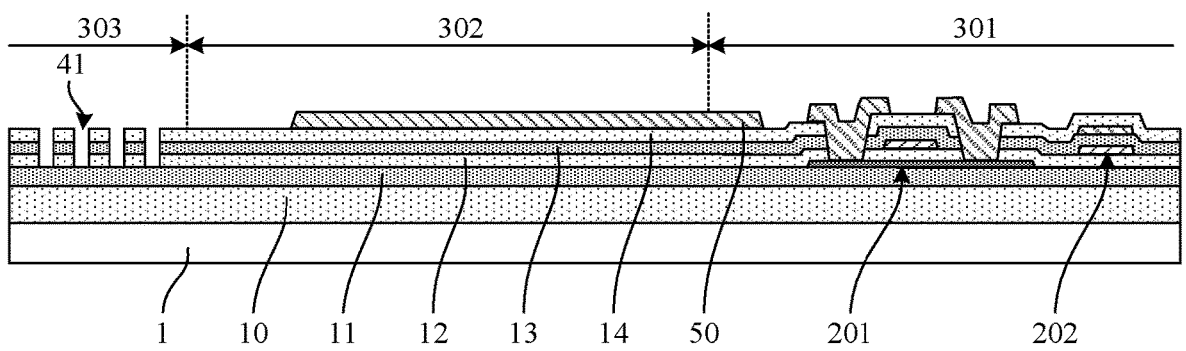

Subsequently, a pattern of cracks of the crack dam area 303 is formed. In an exemplary implementation mode, forming the pattern of cracks may include: forming multiple cracks 41 in the crack dam area 303 through a patterning process, the fourth insulation layer 14, the third insulation layer 13, and the second insulation layer 12 in the multiple cracks 41 are etched off to expose a surface of the first insulation layer 11, as shown in FIGS. 10a and 10b. FIG. 10a illustrates a cross-sectional structure of the pixel area 110 and the pin area 120 in the display region, and is a cross-sectional view in an A-A direction in FIG. 7, and FIG. 10b illustrates a cross-sectional structure of the circuit area 301, the isolation dam area 302, and the crack dam area 303 in the bezel region.

In an exemplary implementation mode, formation of the pattern of cracks may be performed in synchronization with a process of forming a pattern of a bending area in a bonding region.

Thus, preparation of the patterns of the driving structure layer, the circuit structure layer, the isolation structure layer, and the crack structure layer are completed. In an exemplary implementation mode, the first active layer, the first gate electrode, the first source electrode, and the first drain electrode constitute a first transistor 101 of a pixel drive circuit, the second active layer, the second gate electrode, the second source electrode, and the second drain electrode constitute a second transistor 201 of a GOA, the first capacitor electrode and the third capacitor electrode constitute a first storage capacitor 102 of the pixel drive circuit, and the second capacitor electrode and the fourth capacitor electrode constitute a second storage capacitor 202 of the GOA. In an exemplary implementation mode, the first transistor 101 may be a driving transistor in the pixel drive circuit, and the second transistor 201 may be a switch transistor in the GOA.

In an exemplary implementation mode, the first insulation layer, the second insulation layer, the third insulation layer, and the fourth insulation layer may be made of any one or more of Silicon Oxide (SiOx), Silicon Nitride (SiNx), and Silicon Nitride (SiON), and each may be a single layer, a multi-layer, or a composite layer. The first insulation layer may be referred to as a buffer layer, the second insulation layer and the third insulation layer may be referred to as Gate insulators (GI)r, and the fourth insulation layer may be referred to as an Interlayer Dielectric (ILD) layer. The first conductive thin film, the second conductive thin film, and the third conductive thin film may be made of metal materials, such as any one or more of silver (Ag), copper (Cu), aluminum (A1), titanium (Ti), and molybdenum (Mo), or alloy materials of the aforementioned metals, such as Aluminum Neodymium alloy (AlNd) or Molybdenum Niobium alloy (MoNb), and may be in a single-layer structure or a multi-layer composite structure, such as Ti/Al/Ti. An active layer thin film may be made of an amorphous Indium Gallium Zinc Oxide (a-IGZO), Zinc OxyNitride (ZnON), Indium Zinc Tin Oxide (IZTO), amorphous Silicon (a-Si), polycrystalline Silicon (p-Si), hexathiophene, polythiophene and other materials, that is, the present disclosure is applicable to transistors manufactured based on an oxide technology, a silicon technology, and an organic matter technology.

Figure 11A:
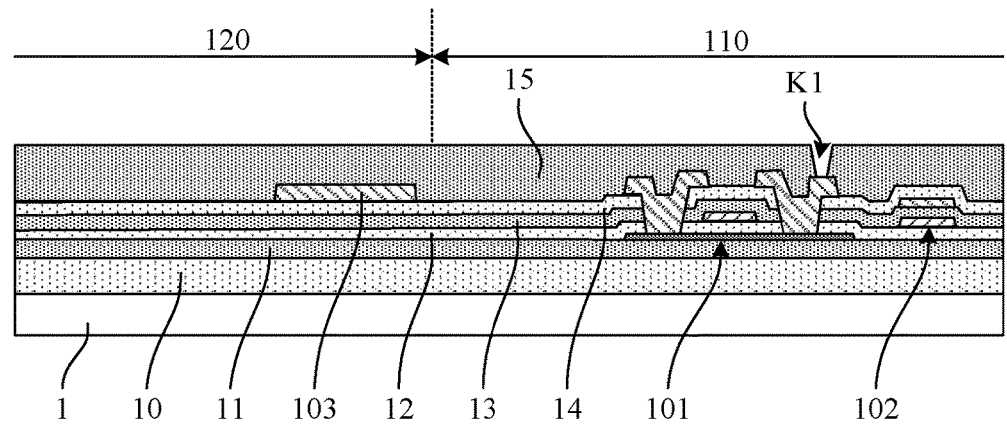
FIGS. 11a and 11b are schematic diagrams after a pattern of a first planarization layer is formed according to an exemplary embodiment of the present disclosure.
Figure 11B:
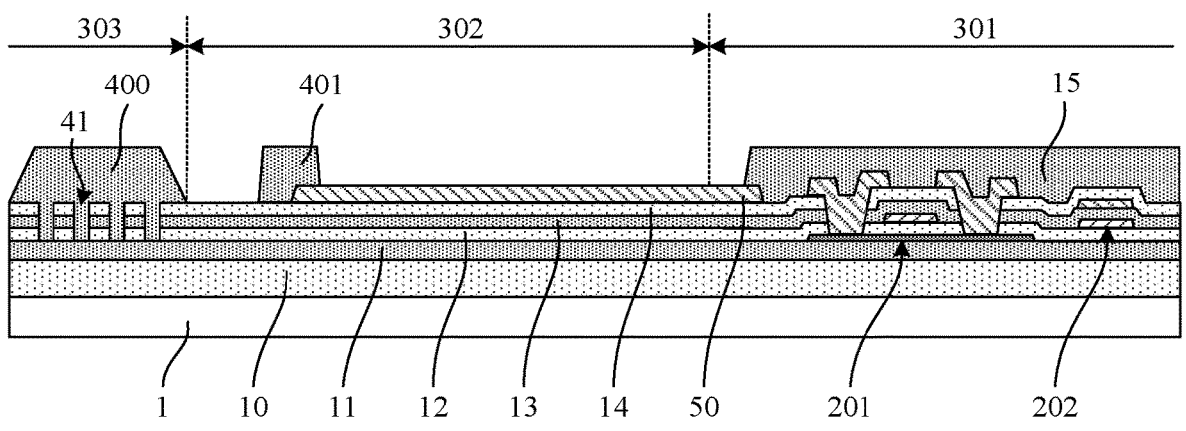

(3) Forming patterns of a first planarization layer, a first dam foundation, and a crack dam. In an exemplary implementation mode, forming the patterns of the first planarization layer, the first dam foundation, and the crack dam may include: coating a first planarization thin film on the base substrate on which the above-mentioned patterns are formed, patterning the first planarization thin film through a patterning process to form patterns of a first planarization layer 15, a first dam foundation 401, and a crack dam 400, as shown in FIGS. 11a and 11b.

In an exemplary implementation mode, the first planarization layer 15 may be located in the display region and the circuit area 301 of the bezel region, the first dam foundation 401 may be located in the isolation dam area 302 of the bezel region, and the crack dam 400 may be located in the crack dam area 303 of the bezel region.

In an exemplary implementation mode, in the pixel area 110 of the display region, the first planarization layer 15 may cover the first source electrode and the first drain electrode. The first planarization layer 15 is provided with a first via K1, and the first planarization layer 15 in the first via K1 is removed to expose a surface of the first drain electrode. The first via K1 is configured to connect an anode connection electrode to be formed subsequently with the first drain electrode of the first transistor 101 through the first via.

In an exemplary implementation mode, in the pin area 120 of the display region, the first planarization layer 15 may cover the signal lead 103.

In an exemplary implementation mode, in the circuit area 301 of the bezel region, the first planarization layer 15 may cover the second source electrode and the second drain electrode and cover an edge of the power supply line 50 close to the display region.

In an exemplary implementation mode, in the isolation dam area 302 of the bezel region, the first dam foundation 401 may be located on a side of the power supply line 50 away from the display region, and the first dam foundation 401 covers an edge of the power supply line 50 away from the display region, that is, an orthographic projection of the edge of the power supply line 50 away from the display region on the base substrate is within a range of an orthographic projection of the first dam foundation 401 on the base substrate. The first planarization thin film in a region between the first dam foundation 401 and the circuit area 301 is removed to expose a surface of the power supply line 50.

In an exemplary implementation mode, in a plane perpendicular to the display substrate, a cross-sectional shape of the first dam foundation 401 may be a trapezoid.

In an exemplary implementation mode, in the crack dam area 303 of the bezel region, the first planarization thin film covers and fills multiple cracks 41 to form the crack dam 400. The first planarization thin film in a region between the crack dam 400 and the first dam foundation 401 is removed to expose a surface of the fourth insulation layer 14, that is, the crack dam 400 and the first dam foundation 401 are arranged at intervals, so that a first encapsulation layer to be formed subsequently is in direct contact with the fourth insulation layer 14 in this region, thus ensuring an encapsulation effect and process quality.

In an exemplary implementation mode, this process may be to form a pattern of a fifth insulation layer of an inorganic material first, and then form a pattern of a first planarization layer of an organic material on the fifth insulation layer, which is not limited in the present disclosure.

In an exemplary implementation mode, the first planarization layer may be made of an organic material, such as resin.

Figure 12A:
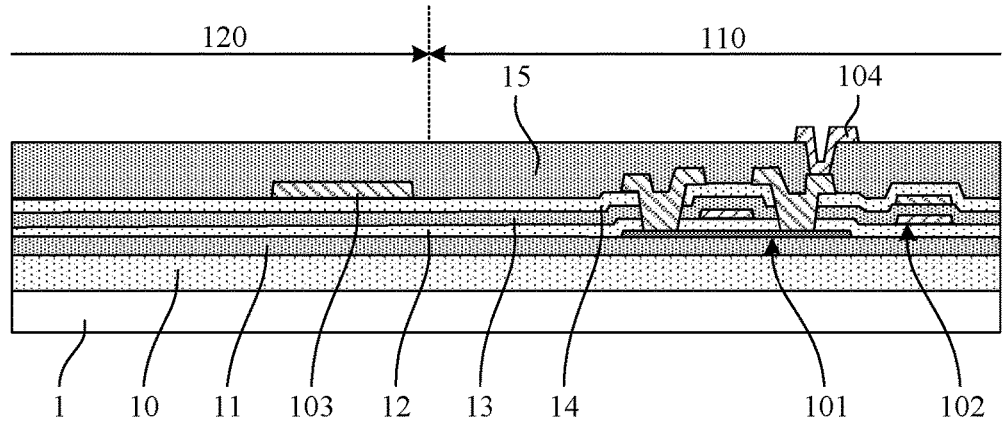
FIGS. 12a and 12b are schematic diagrams after a pattern of a fourth conductive layer is formed according to an exemplary embodiment of the present disclosure.
Figure 12B:
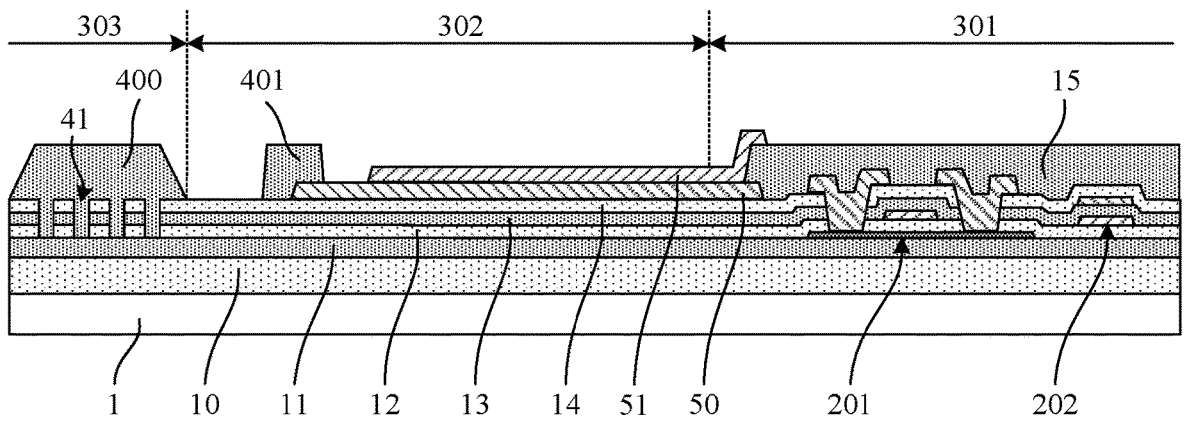

(4) Forming a pattern of a fourth conductive layer. In an exemplary implementation mode, forming the pattern of the fourth conductive layer may include: depositing a fourth conductive thin film on the base substrate on which the above-mentioned patterns are formed, and patterning the fourth conductive thin film through a patterning process to form the pattern of the fourth conductive layer on the first planarization layer 15, as shown in FIGS. 12a and 12b.

In an exemplary implementation mode, the pattern of the fourth conductive layer at least includes an anode connection electrode 104 located in the pixel area 110 in the display region, and a first connection electrode 51 located in the isolation dam area 302 in the bezel region, wherein the anode connection electrode 104 is connected with the first drain electrode through the first via K1, and at least part of the first connection electrode 51 is lapped on the power supply line 50.

In an exemplary implementation mode, an edge of a side of the first connection electrode 51 away from the display region may be located on a side of the first dam foundation 401 close to the display region and is spaced apart by a distance, and an orthographic projection of the first connection electrode 51 on the base substrate is not overlapped with an orthographic projection of the first dam foundation 401 on the base substrate.

In an exemplary implementation mode, an edge of a side of the first connection electrode 51 close to the display region may be lapped on the first planarization layer 15 of the circuit area 301, and an orthographic projection of the first connection electrode 51 on the base substrate is at least partially overlapped with an orthographic projection of the first planarization layer 15 of the circuit area 301 on the base substrate.

In an exemplary implementation mode, an edge of a side of the first connection electrode 51 away from the display region may be indented towards the display region with respect to an edge of a side of the power supply line 50 away from the display region, so that end portions of the power supply line 50 and the first connection electrode 51 form a stepped structure.

In some possible exemplary implementation modes, structures such as corresponding signal lines may be provided on the first planarization layer 15 of the pin area 120, which is not limited in the present disclosure.

Figure 13A:
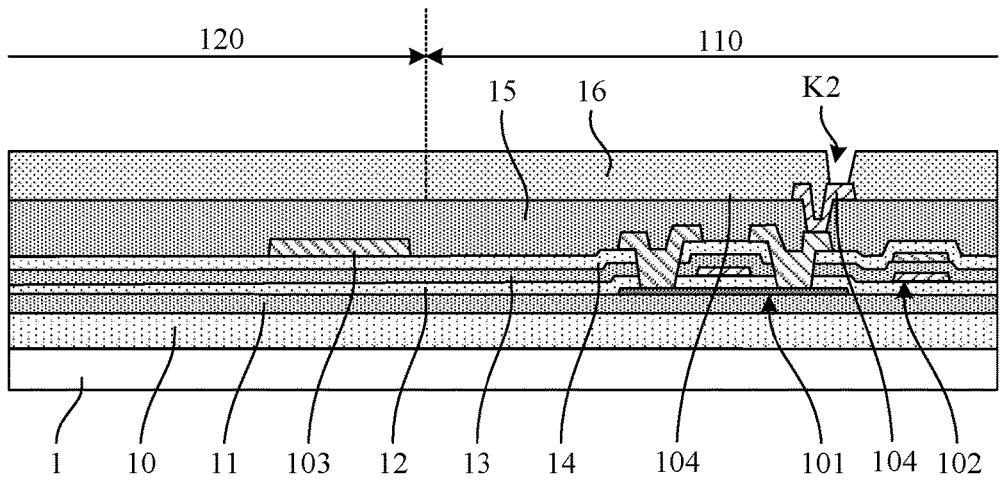
FIGS. 13a and 13b are schematic diagrams after a pattern of a second planarization layer is formed according to an exemplary embodiment of the present disclosure.
Figure 13B:
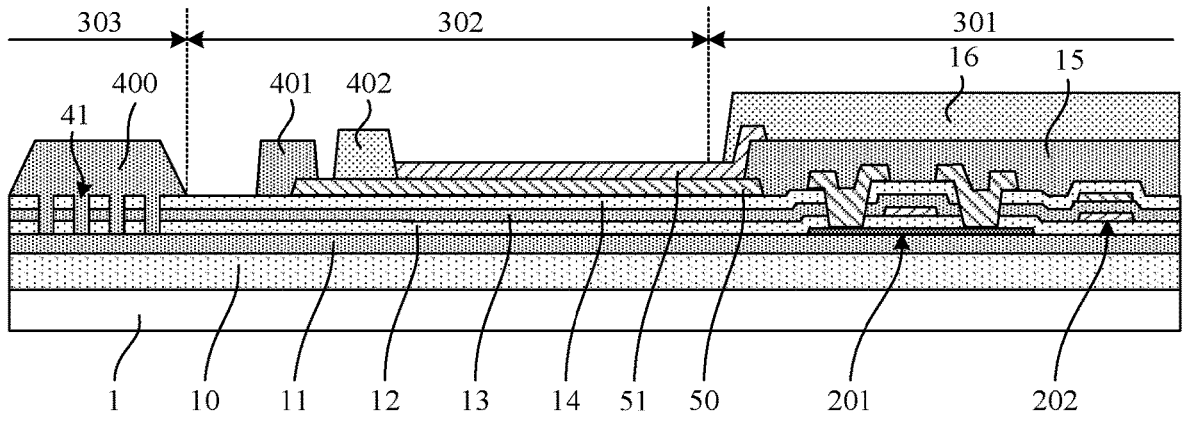

(5) Forming patterns of a second planarization layer and a second dam foundation. In an exemplary implementation mode, forming the patterns of the second planarization layer and the second dam foundation may include: coating a second planarization thin film on the base substrate on which the above-mentioned patterns are formed, patterning the second planarization thin film through a patterning process to form patterns of a second planarization layer 16 and a second dam foundation 402, as shown in FIGS. 13a and 13b.

In an exemplary implementation mode, the second planarization layer 16 may be located in the display region and the circuit area 301 of the bezel region, and the second dam foundation 402 may be located in the isolation dam area 302 of the bezel region.

In an exemplary implementation mode, in the pixel area 110 of the display region, the second planarization layer 16 may cover the anode connection electrode 104. A second via K2 is provided on the second planarization layer 16. The second planarization layer 16 in the second via K2 is removed to expose a surface of the anode connection electrode 104. The second via K2 is configured such that an anode to be formed subsequently is connected with the anode connection electrode 104 through the via. In the pin area 120 of the display region, the second planarization layer 16 may be disposed on the first planarization layer 15. In the circuit area 301 of the bezel region, the second planarization layer 16 may be disposed on the first planarization layer 15, a side of the second planarization layer 16 away from the display region extends to the isolation dam area 302, and covers an edge of the first connection electrode 51 close to the display region.

In an exemplary implementation mode, in the isolation dam area 302 of the bezel region, the second dam foundation 402 may be located on a side of the first connection electrode 51 away from the display region and spaced apart by a distance, i.e. the first dam foundation 401 and the second dam foundation 402 are arranged at intervals. An orthographic projection of the second dam foundation 402 on the base substrate is not overlapped with an orthographic projection of the first dam foundation 401 on the base substrate, and a region between the second dam foundation 402 and the first dam foundation 401 exposes a surface of the power supply line 50.

In an exemplary implementation mode, the second dam foundation 402 covers an edge of a side of the first connection electrode 51 away from the display region, and an orthographic projection of the edge of the side of the first connection electrode 51 away from the display region on the base substrate is within a range of an orthographic projection of the second dam foundation 402 on the base substrate.

In an exemplary implementation mode, since the edge of the power supply line 50 on the side away from the display region is covered by the first dam foundation 401, the edge of the side of the first connection electrode 51 away from the display region is covered by the second dam foundation 402, so that the edge of the power supply line and the edge of the first connection electrode are respectively wrapped by different dam foundations, thus peeling failure of edges may be effectively prevented. In an exemplary implementation mode, since the edge of the side of the first connection electrode 51 close to the display region is covered by the second planarization layer 16, thus peeling failure of an edge may be effectively prevented.

In an exemplary implementation mode, in a plane perpendicular to the base substrate, a cross-sectional shape of the second dam foundation 402 may be a trapezoid.

In an exemplary implementation mode, the second planarization layer may be made of an organic material, such as resin.

In some possible exemplary implementation modes, a second planarization thin film may be provided on the crack dam 400, which is not limited in the present disclosure.

Figure 14A:
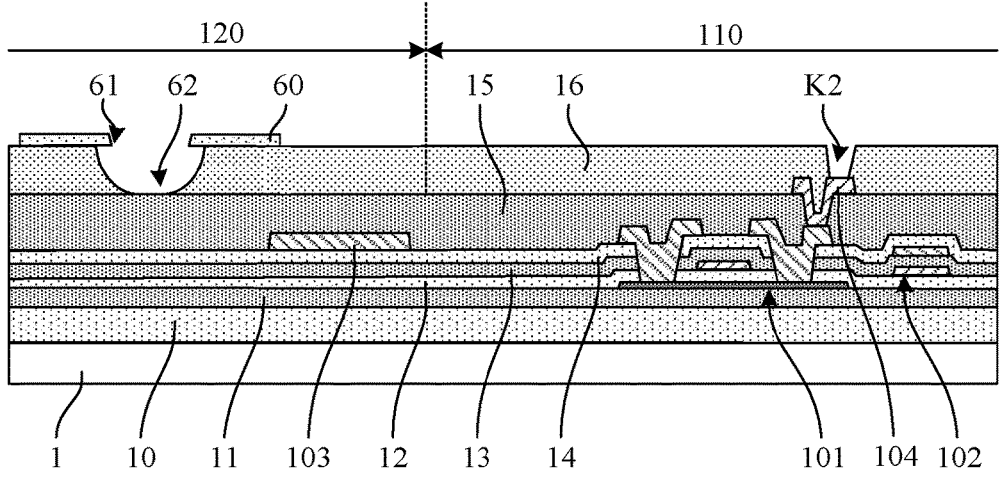
FIGS. 14a and 14b are schematic diagrams after a pattern of a pin structure is formed according to an exemplary embodiment of the present disclosure.
Figure 14B:
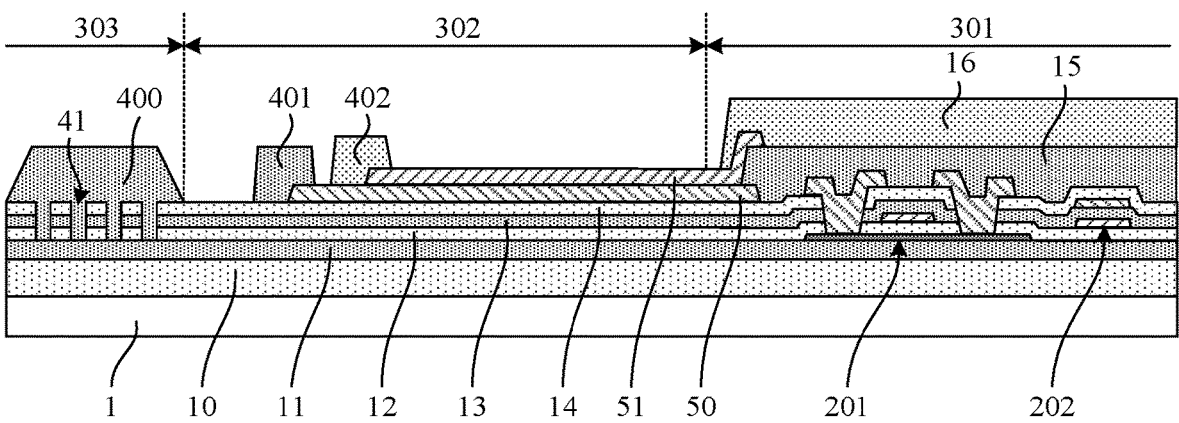

(6) Forming a pattern of a pin structure. In an exemplary implementation mode, forming the pattern of the pin structure may include: depositing a partition thin film on the base substrate on which the above-mentioned patterns are formed, patterning the partition thin film through a patterning process to form the pattern of the pin structure in the pin area 120 of the display region, wherein the pin structure may include a partition layer 60 provided on the second planarization layer 16, a partition hole 61 is provided on the partition layer 60, a partition groove 62 is provided on the second planarization layer 16 in a region where the partition layer 60 is located, and the partition hole 61 and the partition groove 62 communicate with each other, as shown in FIGS. 14*a* and 14*b*.

In an exemplary implementation mode, a process of forming the pattern of the pin structure may include: depositing a partition thin film on the base substrate on which the above-mentioned patterns are formed. Then, a layer of photoresist is coated on the partition thin film, and the photoresist is exposed by using a mask. After development, a fully exposed region and an unexposed region are formed, and the photoresist in the fully exposed region is removed and the photoresist in the unexposed region is retained. Then, the partition thin film in the fully exposed region is etched by using an etching process, and the partition layer 60 provided on the second planarization layer 16 and the partition hole 61 located in a middle region of the partition layer 60 are formed in the pin area 120 of the display region, wherein the partition hole 61 exposes a surface of the second planarization layer 16. Subsequently, the second planarization layer 16 exposed in the partition hole 61 is continuously etched, and the partition groove 62 is formed on the second planarization layer 16 in the region where the partition layer 60 is located, so that the partition hole 61 and the partition groove 62 communicate with each other.

In an exemplary implementation mode, the etching may be performed using a dry etching process and using a gas with a relatively large organic/inorganic etching ratio, such as $O_2$, $CF_4$, and $CHF_3$. The organic/inorganic etching ratio is relatively large, that is, an etching rate for etching the organic material is greater than an etching rate for etching the inorganic material, so when the second planarization layer 16 is etched, the partition groove 62 is etched laterally, and the partition groove 62 expands a distance with respect to the partition hole 61 to form the partition groove 62 with a side-etched structure.

In an exemplary implementation mode, the partition layer 60 located at a periphery of the partition hole 61 has a protruding part with respect to a side wall of the partition groove 62. With respect to the protruding part, the side wall of the partition groove 62 (a side close to the partition hole 61) forms an inwardly recessed structure. With respect to the side wall of the partition groove 62, the protruding part forms an "eave" structure, and the partition layer 60, the partition hole 61, and the partition groove 62 form a pin structure.

In an exemplary implementation mode, a width of the partition layer 60 projecting from an opening edge of the partition groove 62 may be about 1 μm to 3 μm, i.e. the partition groove 62 extends outwardly from 1 μm to 3 μm relative to the partition hole 61.

In an exemplary implementation mode, in a plane perpendicular to the base substrate, a cross-sectional shape of the partition groove 62 may be an inverted trapezoid, and a width of an upper opening of a side of the partition groove 62 away from the base substrate is greater than a width of a lower opening of a side of the partition groove 62 close to the base substrate. In an exemplary implementation mode, sides of the inverted trapezoid-shaped partition groove 62 may be arc-shaped.

In an exemplary implementation mode, an aperture of the partition hole 61 may be smaller than an aperture of an opening on the partition groove 62, and an orthographic projection of an opening of the partition hole 61 on the base substrate may be within a range of an orthographic projection of the opening on the partition groove 62 on the base substrate.

In an exemplary implementation mode, a depth of the partition groove 62 may be less than or equal to a thickness of the second planarization layer 16.

In an exemplary implementation mode, the partition layer may be made of any one or more of Silicon Oxide (SiOx), Silicon Nitride (SiNx), and Silicon Oxynitride (SiON), and may be a single-layer, a multi-layer, or a composite layer. In some possible exemplary implementation modes, the partition layer may be made of a metallic material, which is not limited in the present disclosure.

After this process, structures of the pixel area 110 of the display region, and the circuit area 310, the isolation dam area 302, and the crack dam area 303 of the bezel region may be the same as those after a previous process.

Figure 15A:
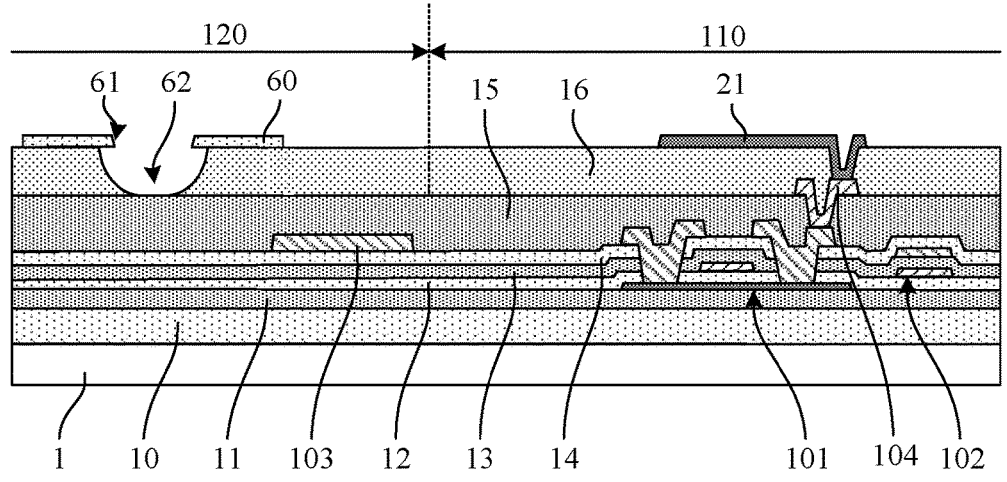
FIGS. 15a and 15b are schematic diagrams after a pattern of an anode is formed according to an exemplary embodi- ment of the present disclosure.
Figure 15B:
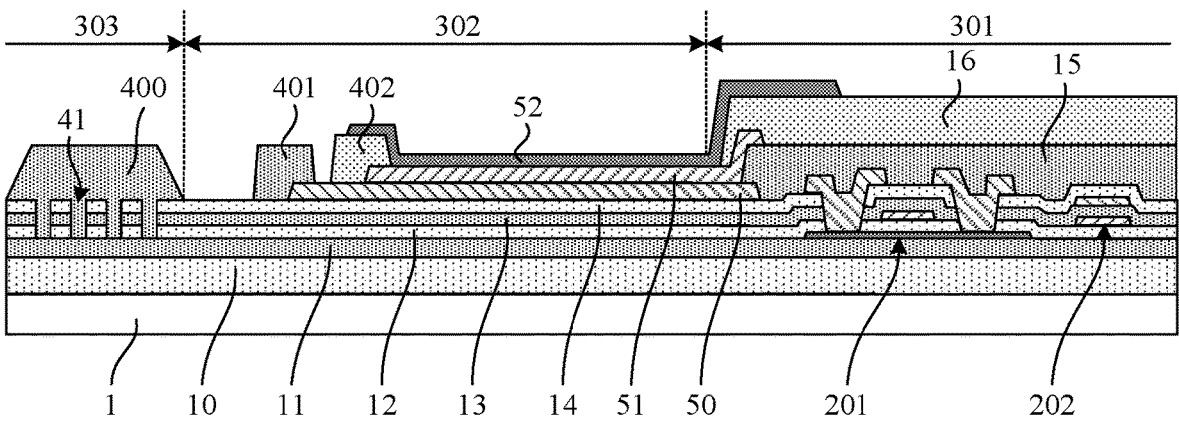

(7) Forming patterns of an anode and a second connection electrode. In an exemplary implementation mode, forming the patterns of the anode and the second connection electrode may include: depositing a conductive thin film on the base substrate on which the above-mentioned patterns are formed, patterning the conductive thin film through a patterning process to form patterns of an anode 21 and a second connection electrode 52, as shown in FIGS. 15*a* and 15*b*.

In an exemplary implementation mode, the anode 21 may be located on the second planarization layer 16 of the pixel area 110 in the display region and the anode 21 is connected with the anode connection electrode 104 through the second via K2. Since the anode connection electrode 104 is connected with the first drain electrode 104 of the first transistor 101 through a via, a connection between the anode 21 and the first drain electrode of the first transistor 101 is achieved through the anode connection electrode 104.

In an exemplary implementation mode, the second connection electrode 52 may be located in the circuit area 301 and the isolation dam area 302 of the bezel region, a side of the second connection electrode 52 close to the display region is located in the circuit area 301, and is lapped on the second planarization layer 16. An orthographic projection of an edge of the side of the second connection electrode 52 close to the display region on the base substrate is within a range of an orthographic projection of the second planarization layer 16 on the base substrate. A side of the second connection electrode 52 away from the display region is located in the isolation dam area 302 and covers part of a surface of the second dam foundation 402. An orthographic projection of the edge of the side of the second connection electrode 52 away from the display region on the base substrate is within a range of an orthographic projection of the second dam foundation 402 on the base substrate. A middle portion of the second connection electrode 52 is lapped on the first connection electrode 51, and an orthographic projection of the second connection electrode 52 on the base substrate is at least partially overlapped with an orthographic projection of the first connection electrode 51 on the base substrate.

In an exemplary implementation mode, the orthographic projection of the second connection electrode 52 on the base substrate is not overlapped with the orthographic projection of the first dam foundation 401 on the base substrate.

In an exemplary implementation mode, the second connection electrode 52 may completely cover a side surface of a side of the second dam foundation 402 close to the display region and partially cover an upper surface of a side of the second dam foundation 402 away from the base substrate. The second connection electrode 52 is configured to be connected with a cathode to be formed subsequently, so that the cathode is reliably connected with the power supply line 50 through the second connection electrode 52 and the first connection electrode 51.

In an exemplary implementation mode, an orthographic projection of an edge of a side of the first connection electrode 51 away from the display region on the base substrate may be within a range of an orthographic projection of the second connection electrode 52 on the base substrate, that is, the edge of the side of the first connection electrode 51 away from the display region is indented towards the display region with respect to an edge of a side of the second connection electrode 52 away from the display region.

Since the edge of the side of the first connection electrode 51 away from the display region is covered by the second dam foundation 402 and the second connection electrode 52 covers part of the surface of the second dam foundation 402, the edge of the first connection electrode 51 is sequentially wrapped by the second dam foundation 402 and the second connection electrode 52, and the formed multiple wrappings may effectively prevent peeling failure of the edge of the first connection electrode 51. Since the edge of the side of the first connection electrode 51 close to the display region is covered by the second planarization layer 16, and the edge of the side of the second planarization layer 16 away from the display region is covered by the second connection electrode 52, the formed multiple wrappings may effectively prevent peeling failure of the edge of the first connection electrode 51.

In an exemplary implementation mode, a material of a conductive thin film may be a metal material or a transparent conductive material, and the metal material may include any one or more of silver (Ag), copper (Cu), aluminum (Al), titanium (TI), and molybdenum (Mo), or an alloy material of the above metals, and the transparent conductive material may be Indium Tin Oxide (ITO) or Indium Zinc Oxide (IZO), etc. In an exemplary implementation mode, the conductive thin film may have a single-layer structure or a multi-layer composite structure, such as ITO/AI/ITO.

Figure 16A:
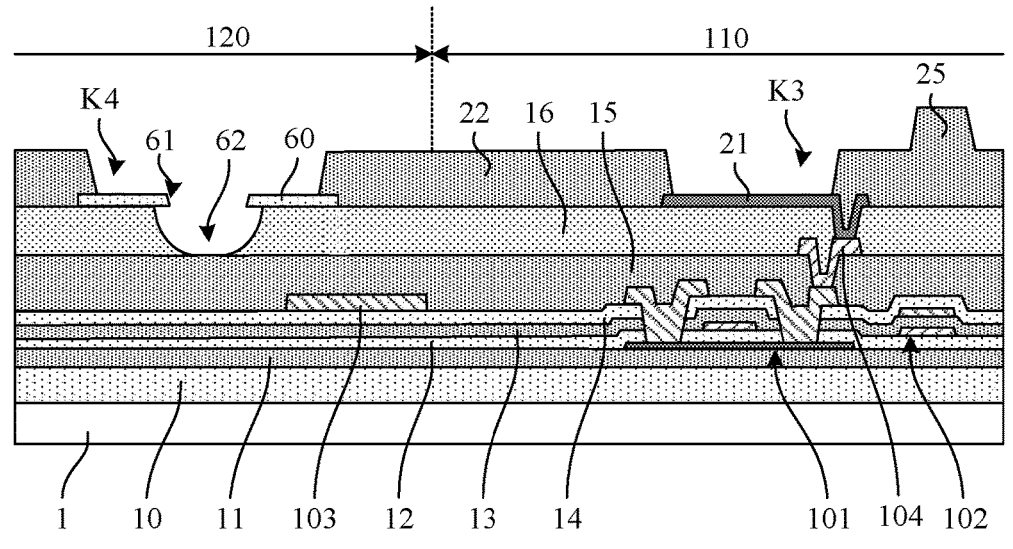
FIGS. 16a and 16b are schematic diagrams after a pattern of a pixel definition layer is formed according to an exem- plary embodiment of the present disclosure.
Figure 16B:
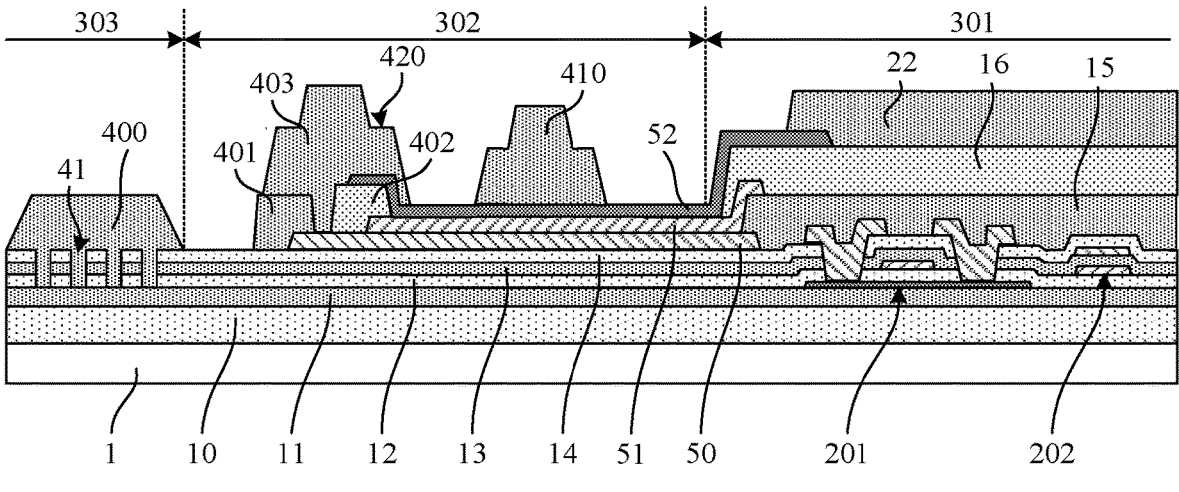

(8) Forming patterns of a pixel definition layer, a first isolation dam, and a third dam foundation. In an exemplary implementation mode, forming the patterns of the pixel definition layer, the first isolation dam, and the third dam foundation may include coating a pixel definition thin film on the base substrate on which the above-mentioned patterns are formed, patterning the pixel definition thin film through a patterning process to form patterns of a pixel definition layer 22, a first isolation dam 410, and a third dam foundation 403, as shown in FIGS. 16a and 16b.

In an exemplary implementation mode, the pixel definition layer 22 is formed in the display region and the circuit area 301 of the bezel region. The pixel definition layer 22 of the pixel area 100 is provided with a first pixel opening K3, the pixel definition layer 22 of the pin area 120 is provided with a second pixel opening K4. The pixel definition thin film in the first pixel opening K3 is removed to expose a surface of the anode 21, and the pixel definition thin film in the second pixel opening K4 is removed to expose the pin structure, that is, the second pixel opening K4 exposes the partition hole 61, the partition groove 62, and the partition layer 60 at the periphery of the partition hole 61.

In an exemplary implementation mode, in the pin area 120, the pixel definition layer 22 may cover an outer edge of the partition layer 60 away from the partition hole 61, wherein an orthographic projection of the outer edge of the partition layer 60 away from the partition hole 61 on the base substrate is within a range of an orthographic projection of the pixel definition layer 22 on the base substrate, which may prevent peeling failure of the partition layer 60.

In an exemplary implementation mode, a patterning process of a half tone mask or a gray tone mask may be employed to form a pattern of a post spacer 25 during formation of the pixel definition layer, wherein the post spacer 25 may be disposed outside of a pixel opening, and the post spacer 25 is configured to support a fine metal mask in a subsequent evaporation process.

In an exemplary implementation mode, the pixel definition layer 22 of the circuit area 301 covers an edge of a side of the second connection electrode 52 close to the display region, and an orthographic projection of the edge of the side of the second connection electrode 52 close to the display region on the base substrate is within a range of an orthographic projection of the pixel definition layer 22 on the base substrate.

In an exemplary implementation mode, the first isolation dam 410 and the third dam foundation 403 may be located in the isolation dam area 302, the first isolation dam 410 may be located on a side of the second dam foundation 402 close to the display region, and the third dam foundation 403 may be located in a region where the first dam foundation 401 and the second dam foundation 402 are located.

In an exemplary implementation mode, the first isolation dam 410 may be disposed on the second connection electrode 52, and an orthographic projection of the first isolation dam 410 on the base substrate is within a range of an orthographic projection of the second connection electrode 52 on the base substrate. Since this process is a patterning process using a half tone mask or a gray tone mask, the first isolation dam 410 may include a lower dam foundation and an upper dam foundation which are stacked, and an orthographic projection of the upper dam foundation on the base substrate may be within a range of an orthographic projection of the lower dam foundation on the base substrate, and a stepped structure is formed. In an exemplary implementation mode, in a plane perpendicular to the base substrate, a cross-sectional shape of the upper dam foundation may be a trapezoid.

In an exemplary implementation mode, the third dam foundation 403 may be disposed on a side of the first dam foundation 401 and the second dam foundation 402 away from the base substrate and fills a region between the first dam foundation 401 and the second dam foundation 402, wherein an orthographic projection of the third dam foundation 403 on the base substrate is at least partially overlapped with orthographic projections of the first dam foundation 401 and the second dam foundation 402 on the base substrate.

In an exemplary implementation mode, the third dam foundation 403 covers an edge of a side of the second connection electrode 52 away from the display region, i.e. an orthographic projection of the edge of the side of the second connection electrode 52 away from the display region on the base substrate is within a range of an orthographic projection of the third dam foundation 403 on the base substrate. Since this process is a patterning process using a half tone mask or a gray tone mask, the third dam foundation 403 may include a lower dam foundation and an upper dam foundation which are stacked, and an orthographic projection of the upper dam foundation on the base substrate may be within a range of an orthographic projection of the lower dam foundation on the base substrate, and a stepped structure is formed. In an exemplary implementation mode, in a plane perpendicular to the base substrate, a cross-sectional shape of the upper dam foundation may be a trapezoid.

In an exemplary implementation mode, an orthographic projection of an edge of a side of the power supply line 50 away from the display region on the base substrate is within a range of an orthographic projection of the third dam foundation 403 on the base substrate, and an orthographic projection of an edge of a side of the first connection electrode 51 away from the display region is within a range of the orthographic projection of the third dam foundation 403 on the base substrate. Since an edge of the power supply line 50 is covered by the first dam foundation 401, an edge of the first connection electrode 51 is covered by the second dam foundation 402, and the third dam foundation 403 covers the first dam foundation 401 and the second dam foundation 402, forming a structure of multiple wrapping edge of the power supply line 50 and edge of the first connection electrode 51, so that peeling failure of the edge of the power supply line 50 and the edge of the first connection electrode 51 may be effectively prevented. Since the third dam foundation 403 covers the edge of the side of the second connection electrode 52 away from the display region, and the pixel definition layer 22 of the circuit area 301 covers the edge of the side of the second connection electrode 52 close to the display region, peeling failure of the edge of the second connection electrode 52 may be effectively prevented.

In an exemplary implementation mode, the first dam foundation 401, the second dam foundation 402, and the third dam foundation 403 constitute the second isolation dam 420, wherein the second isolation dam 420 is located on a side of the first isolation dam 410 away from the display region, and an orthographic projection of the first isolation dam 410 on the base substrate is not overlapped with an orthographic projection of the second isolation dam 420 on the base substrate.

In an exemplary implementation mode, a distance between a top surface of the second isolation dam 420 (a surface of a side of the second isolation dam away from the base substrate) and the base substrate may be greater than a distance between a top surface of the first isolation dam 410 (a surface of a side of the first isolation dam away from the base substrate) and the base substrate.

In an exemplary implementation mode, the pixel definition layer may be made of polyimide, acrylic, polyethylene terephthalate, or the like. In a plane parallel to the display substrate, the first pixel opening and the second pixel opening may be in a shape of a triangle, a rectangle, a polygon, a circle, an ellipse, or the like. In a plane perpendicular to the display substrate, cross-sectional shapes of the first pixel opening and the second pixel opening may be rectangles, trapezoids or the like, and cross-sectional shapes of the first isolation dam 410 and the second isolation dam 420 may be trapezoids having a stepped structure.

Figure 17A:
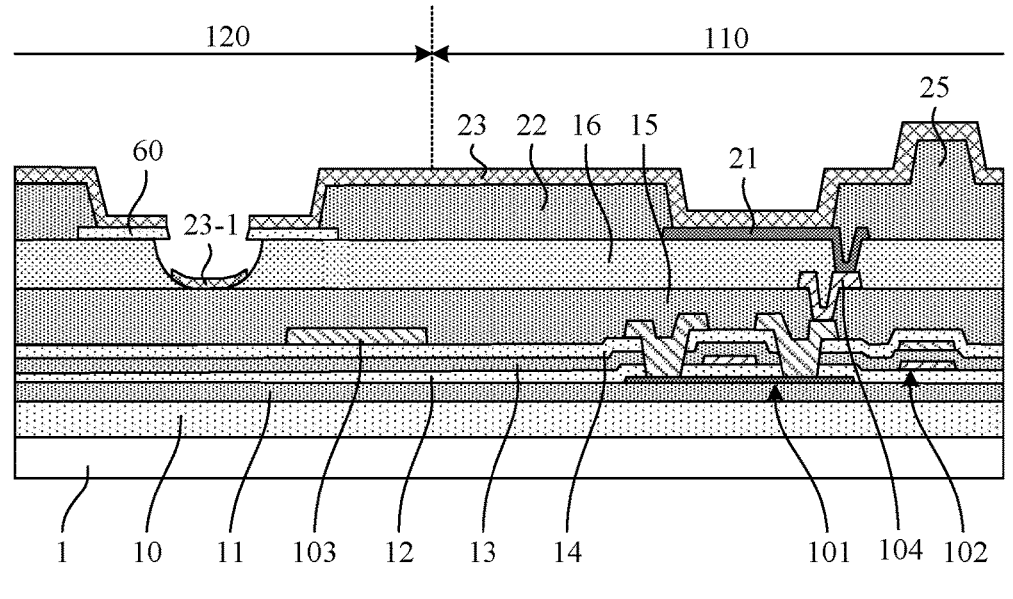
FIGS. 17a and 17b are schematic diagrams after a pattern of an organic light emitting layer is formed according to an exemplary embodiment of the present disclosure.
Figure 17B:
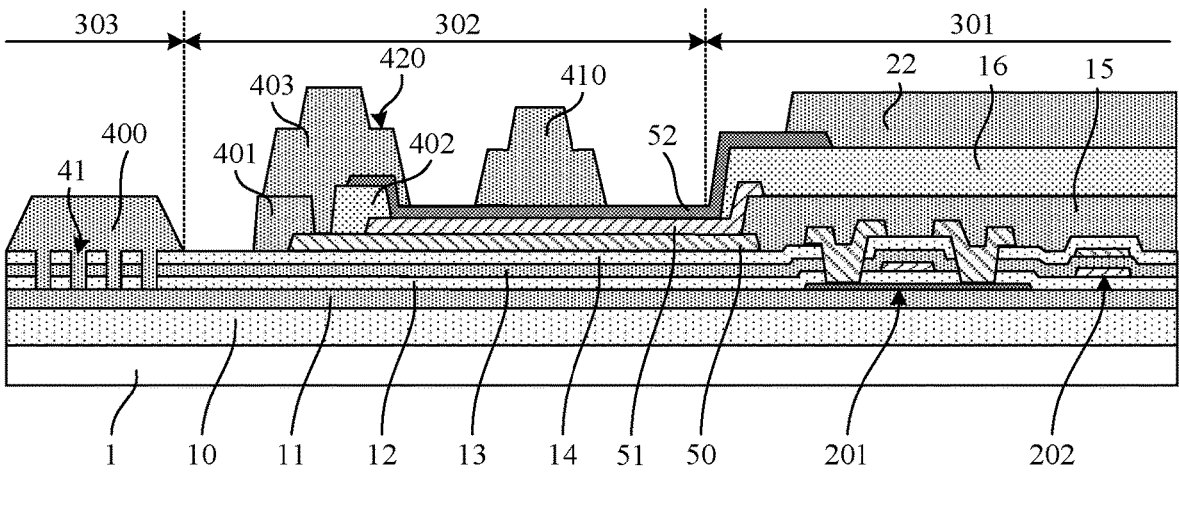

(9) Forming patterns of an organic light emitting layer and an organic light emitting block. In an exemplary implementation mode, forming the patterns of the organic light emitting layer and the organic light emitting block may include: forming patterns of an organic light emitting layer 23 and an organic light emitting block 23-1 by means of evaporation or ink-jet printing on the base substrate on which the above-mentioned patterns are formed, as shown in FIGS. 17*a* and 17*b*.

In an exemplary implementation mode, the organic light emitting layer 23 and the organic light emitting block 23-1 may be formed in the display region, and no organic light emitting layer is formed in the bezel region. The organic light emitting layer 23 of the pixel area 100 is connected with the anode 21 through the first pixel opening K3, and the organic light emitting layer 23 of the pin area 120 is provided on the pixel definition layer 22 and the partition layer 60. Since the partition groove 61 has a side-etched structure and the partition layer 60 has an "eave" structure protruding from an opening of the partition groove 61, the organic light emitting layer 23 of the pin area 120 is disconnected at the "eave" structure of the partition groove 61, and the organic light emitting block 23-1 is formed at a bottom of the partition groove 61, and the organic light emitting block 23-1 and the organic light emitting layer 23 are arranged to be isolated from each other.

In an exemplary implementation mode, an organic light emitting layer may include an Emitting Layer (EML), as well as any one or more of following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation mode, the organic light emitting layer may be prepared and formed through evaporation using a Fine Metal Mask (FMM for short).

In an exemplary implementation mode, the organic light emitting layer may be prepared through a following preparation method. First, a hole injection layer and a hole transport layer are sequentially evaporated by using an open mask, and a common layer of the hole injection layer and the hole transport layer is formed on the display substrate. Then, by using a fine metal mask, an electron block layer and a red emitting layer are evaporated in a red sub-pixel, an electron block layer and a green emitting layer are evaporated in a green sub-pixel, and an electron block layer and a blue emitting layer are evaporated in a blue sub-pixel. Electron block layers and emitting layers of adjacent sub-pixels may be overlapped slightly (for example, an overlapping portion accounts for less than 10% of a region of a pattern of a respective emitting layer), or may be isolated from one another. Then, a hole block layer, an electron transport layer, and an electron injection layer are sequentially evaporated by using an open mask, and a common layer of the hole block layer, the electron transport layer, and the electron injection layer is formed on the display substrate.

In an exemplary implementation mode, an electron block layer may be used as a micro-cavity adjustment layer of a light emitting device. By designing a thickness of an electron block layer, a thickness of an organic light emitting layer between a cathode and an anode may satisfy a design for a length of a micro-cavity. In some exemplary implementation modes, a hole transport layer, a hole block layer, or an electron transport layer in an organic light emitting layer may be used as a micro-cavity adjustment layer of a light emitting device, which is not limited in the present disclosure.

In an exemplary implementation mode, the emitting layer may include a host material and a dopant material doped into the host material. A doping ratio of the dopant material in the emitting layer is 1% to 20%. Within a range of the doping ratio, on one hand, the host material in the emitting layer may effectively transfer exciton energy to the dopant material in the emitting layer to excite the dopant material in the emitting layer to emit light; on the other hand, the host material in the emitting layer "dilutes" the dopant material in the emitting layer, thus effectively improving fluorescence quenching caused by collisions between molecules of the dopant material in the light emitting layer and collisions between energy, and improving a luminous efficiency and device life. In an exemplary implementation mode, the doping ratio refers to a ratio of a mass of the dopant material to a mass of the emitting layer, that is, a mass percentage. In an exemplary implementation mode, the host material and the dopant material may be co-evaporated through a multi-source evaporation process, so that the host material and the dopant material are uniformly dispersed in the emitting layer. A doping ratio may be adjusted by controlling an evaporation rate of the dopant material or by controlling an evaporation rate ratio of the host material to the dopant material during an evaporation process. In an exemplary implementation mode, a thickness of the emitting layer may be about 10 nm to 50 nm.

In an exemplary implementation mode, the hole injection layer may be made of an inorganic oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide or manganese oxide, or may be made of a p-type dopant of a strong electron withdrawing system and a dopant of a hole transport material. In an exemplary implementation mode, a thickness of the hole injection layer may be about 5 nm to 20 nm.

In an exemplary implementation mode, the hole transport layer may be made of a material with high hole mobility, such as an aromatic amine compound, and its substituent group may be carbazole, methylfluorene, spirofluorene, dibenzothiophene or furan. In an exemplary implementation mode, a thickness of the hole transport layer may be about 40 nm to 150 nm.

In an exemplary implementation mode, the hole block layer and the electron transport layer may be made of aromatic heterocyclic compounds, such as benzimidazole derivatives, imidazopyridine derivatives, benzimidazophenanthridine derivatives, and other imidazole derivatives; pyrimidine derivatives, triazine derivatives, and other oxazine derivatives; compounds having a nitrogen-containing six-membered ring structure (also including compounds having a phosphine oxide-based substituent on the heterocyclic ring) such as quinoline derivatives, isoquinoline derivatives, and phenanthroline derivatives. In an exemplary implementation mode, a thickness of the hole block layer may be about 5 nm to 15 nm, and a thickness of the electron transport layer may be about 20 nm to 50 nm.

In an exemplary implementation mode, the electron injection layer may be made of alkali metals or metals, such as lithium fluoride (LiF), ytterbium (Yb), magnesium (Mg), or Calcium (Ca), or compounds of these alkali metals or metals. In an exemplary implementation mode, a thickness of the electron injection layer may be about 0.5 nm to 2 nm.

Figure 18A:
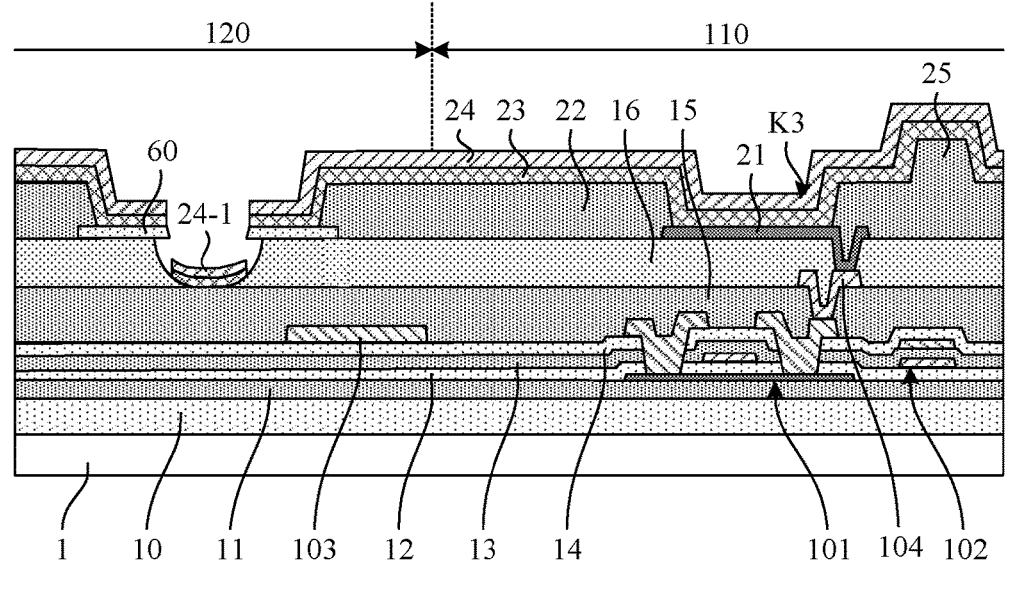
FIGS. 18*a* and 18*b* are schematic diagrams after a pattern of a cathode is formed according to an exemplary embodiment of the present disclosure.
Figure 18B:
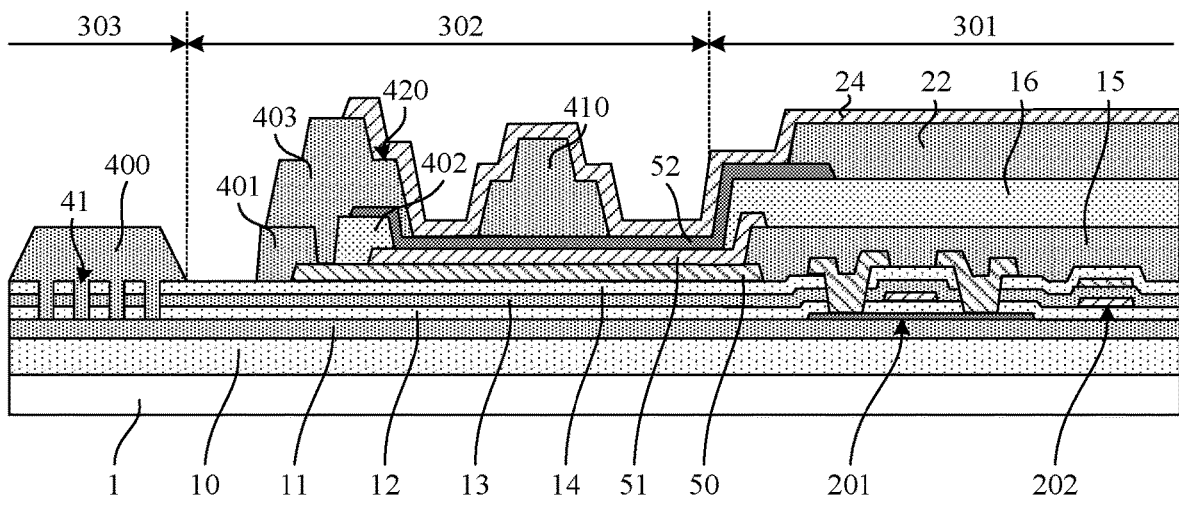

(10) Forming patterns of a cathode and a cathode block. In an exemplary implementation mode, forming the patterns of the cathode and the cathode block may include: forming patterns of a cathode 24 and a cathode block 24-1 by means of evaporation of an open mask on the base substrate on which the above-mentioned patterns are formed, as shown in FIGS. 18a and 18b.

In an exemplary implementation mode, the cathode 24 may be formed in the display region and the circuit area 301 and the isolation dam area 302 of the bezel region, and the cathode 24 may be communicated together to have an integral structure. The cathode 24 of the pixel area 100 is connected with the organic light emitting layer 23 so that the organic light emitting layer 23 is connected with the anode 21 and the cathode 24 at the same time. The cathode 24 of the circuit area 301 is disposed on the pixel definition layer 22 and the cathode 24 of the isolation dam area 302 is lapped with exposed second connection electrode 52. Since the cathode 24 is lapped with the second connection electrode 52, the second connection electrode 52 is lapped with the first connection electrode 51, and the first connection electrode 51 is lapped with the power supply line 50, thus a connection between the cathode 24 and the power supply line 50 is achieved.

In an exemplary implementation mode, the cathode 24 of the isolation dam area 302 is located on a side of the first isolation dam 410 close to the display region, and an orthographic projection of the cathode 24 on the base substrate is not overlapped with orthographic projections of the first isolation dam 410 and the second isolation dam 420 on the base substrate. Or, the cathode 24 of the isolation dam area 302 may completely wrap the first isolation dam 410 and partially wrap the second isolation dam 420. Or, the cathode 24 of the isolation dam area 302 may completely wrap the first isolation dam 410 and the second isolation dam 420, which is not limited in the present disclosure.

In an exemplary implementation mode, the cathode block 24-1 may be formed in the pin area 120 of the display region. Since the partition groove 61 has the side-etched structure and the partition layer 60 has the "eave" structure protruding from the opening in the partition groove 61, the cathode 24 of the pin area 120 is disconnected at the "eave" structure of the partition groove 61, and a cathode block 24-1 is formed on the organic light emitting block 23-1 at a bottom of the partition groove 61, and the cathode block 24-1 and the cathode 24 are arranged to be isolated from each other.

In an exemplary implementation mode, since the edge of the power supply line 50 is covered by the first dam foundation 401, the edge of the first connection electrode 51 is covered by the second dam foundation 402, the third dam foundation 403 covers the first dam foundation 401 and the second dam foundation 402, and the cathode 24 completely or partially covers the second isolation dam 420, thus multiple wrappings of edges of multiple conductive layers are formed, and peeling failure of the edges of the multiple conductive layers may be effectively prevented.

In an exemplary implementation mode, a cathode may be made of any one or more of magnesium (Mg), silver (Ag), aluminum (Al), copper (Cu), and lithium (Li), or an alloy made of any one or more of the above metals.

In some possible exemplary implementation modes, a cathode block may be formed in the crack dam area 303 through a design of a mask, and the cathode block covers the crack dam 400, which is not limited in the present disclosure.

In some possible exemplary implementation modes, patterns of an optical coupling layer and an optical coupling block may be formed after the pattern of the cathode is formed, the optical coupling layer is disposed on the cathode, and the optical coupling block is disposed on the cathode block. A refractive index of the optical coupling layer may be greater than a refractive index of the cathode, which facilitates light extraction and increases a light output efficiency. A material of the optical coupling layer may be an organic material, or an inorganic material, or an organic material and an inorganic material, and may be a single layer, a multi-layer, or a composite layer, which is not limited in the present disclosure.

Hereto, preparation of the light emitting structure layer of the display region is completed. In the pixel area 100, the light emitting structure layer may include an anode 21, a pixel definition layer 22, an organic light emitting layer 23, and a cathode 24. The organic light emitting layer 23 is arranged between the anode 21 and the cathode 24.

Figure 19A:
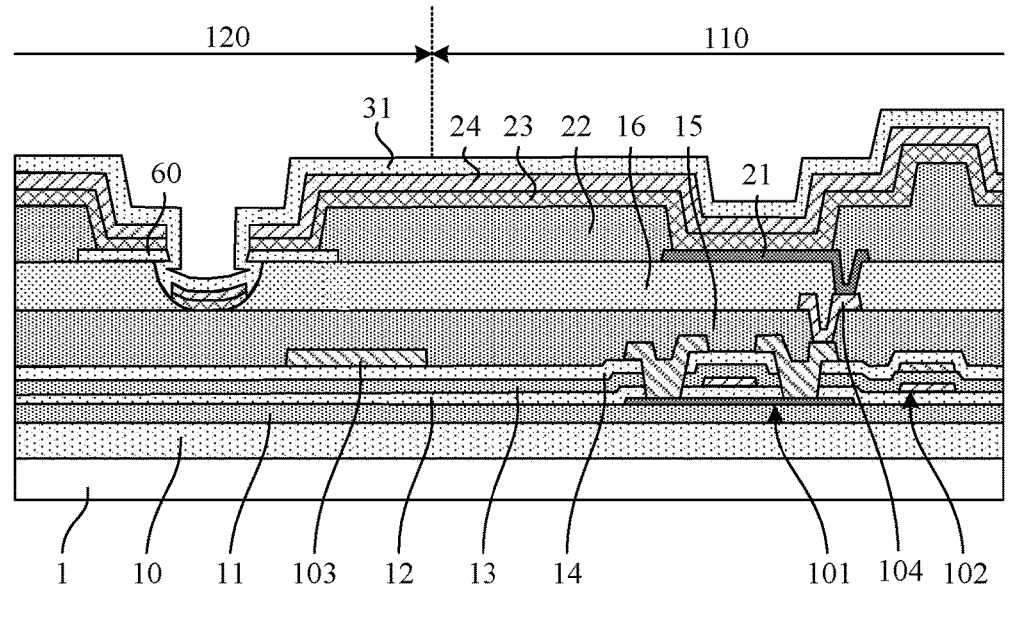
FIGS. 19*a* and 19*b* are schematic diagrams after a pattern of a first encapsulation layer is formed according to an exemplary embodiment of the present disclosure.
Figure 19B:
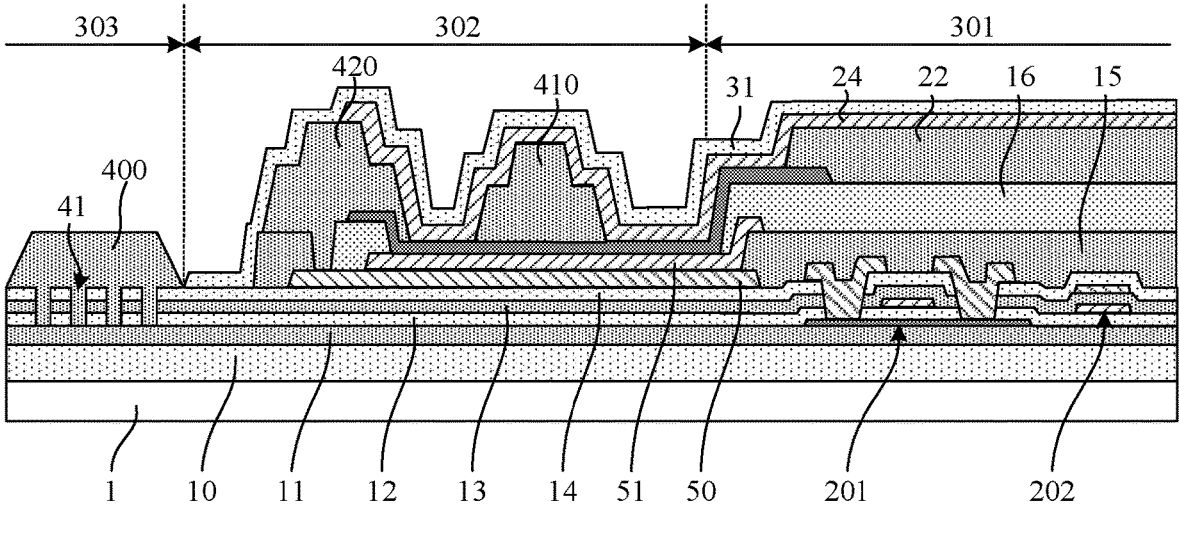

(11) Forming a pattern of a first encapsulation layer. In an exemplary implementation mode, forming the pattern of the first encapsulation layer may include: depositing a first encapsulation thin film by means of deposition using an open mask on the base substrate on which the above-mentioned patterns are formed to form a pattern of a first encapsulation layer 31, as shown in FIGS. 19a and 19b.

In an exemplary implementation mode, the first encapsulation layer 31 may be located in the display region, and the circuit area 301 and the isolation dam area 302 in the bezel region. The first encapsulation layer 31 of the pixel area 110 is disposed on the cathode 24 and the first encapsulation layer 31 of the pin area 120 wraps a pin structure. In an exemplary implementation mode, wrapping the pin structure refers to that the first encapsulation layer 31 covers an upper surface of the cathode 24, covers side surfaces of the organic light emitting layer 23 and of the cathode 24 facing the partition hole 61, covers a side surface of the partition layer 60 facing the partition hole 61 and a lower surface of the partition layer 60 facing the partition groove 62, covers an inner wall of the partition groove 62, and covers the cathode block 24-1 and the organic light emitting block 23-1 at the bottom of the partition groove 62, thereby complete wrapping of the pin structure by the first encapsulation layer 31 is formed. In the exemplary embodiment of the present disclosure, by arranging the pin structure and completely wrapping the pin structure by the first encapsulation layer, the partition groove forms a pin point for an encapsulation layer, thereby enhancing an ability of film layers to resist shear stress and effectively preventing peeling failure of the film layers.

In an exemplary implementation mode, the first encapsulation layer 31 of the circuit area 301 and the isolation dam area 302 is disposed on the cathode 24, and the first encapsulation layer 31 of the isolation dam area 302 wraps the first isolation dam 410 and the second isolation dam 420. In an exemplary implementation mode, wrapping the first isolation dam 410 and the second isolation dam 420 refers to that the first encapsulation layer 31 covers all exposed surfaces of the first isolation dam 410 and the second isolation dam 420.

In an exemplary implementation mode, an edge of the first encapsulation layer 31 away from the display region may be located between the crack dam 400 and the second isolation dam 420, and the first encapsulation layer 31 is lapped with exposed fourth insulation layer 14 to ensure encapsulation quality and effect.

Figures 20A, 20B:
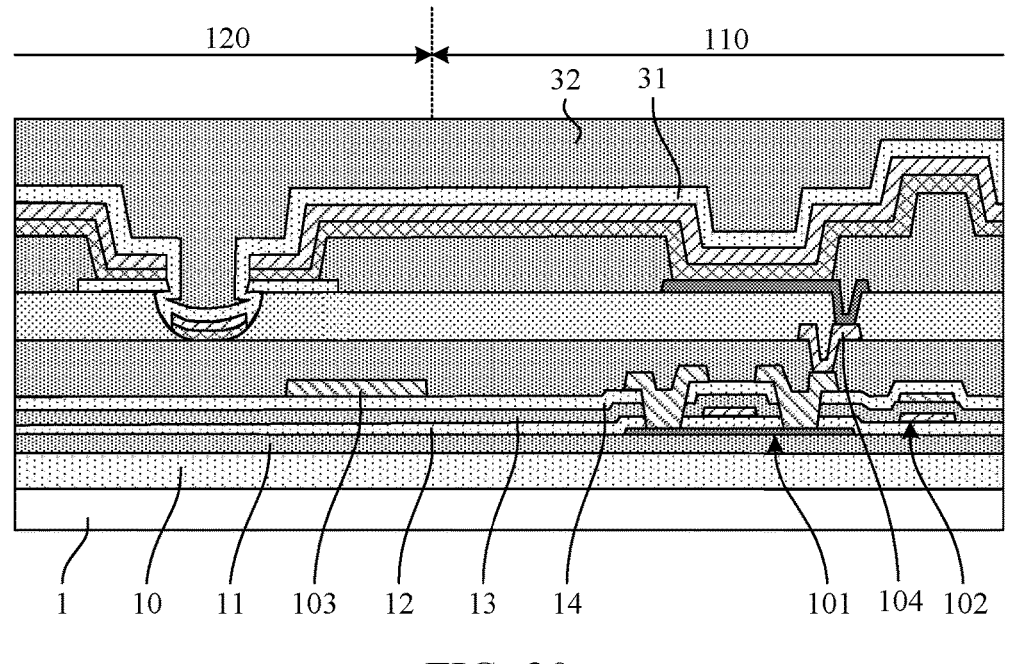
FIGS. 20*a* and 20*b* are schematic diagrams after a pattern of a second encapsulation layer is formed according to an exemplary embodiment of the present disclosure.

(12) Forming a pattern of a second encapsulation layer. In an exemplary implementation mode, forming the pattern of the second encapsulation layer may include: printing a second encapsulation material using an inkjet printing process on the base substrate on which the above-mentioned patterns on formed to form a pattern of a second encapsulation layer 32, as shown in FIGS. 20a and 20b.

In an exemplary implementation mode, the second encapsulation layer 32 may be located in the display region, the circuit area 301 of the bezel region, and a side of the first isolation dam 410 close to the display region in the isolation dam area 302 of the bezel region. The second encapsulation layer 32 of the pixel area 110 and the pin area 120 is disposed on the first encapsulation layer 31 and the second encapsulation layer 32 of the pin area 120 fills the second pixel opening and the partition groove in the pin structure.

In an exemplary implementation mode, in the circuit area 301, the second encapsulation layer 32 is disposed on the first encapsulation layer 31. In the isolation dam area 302, the second encapsulation material is blocked by the first isolation dam 410, and is located on a side of the first isolation dam 410 close to the display region.

Figure 21A:
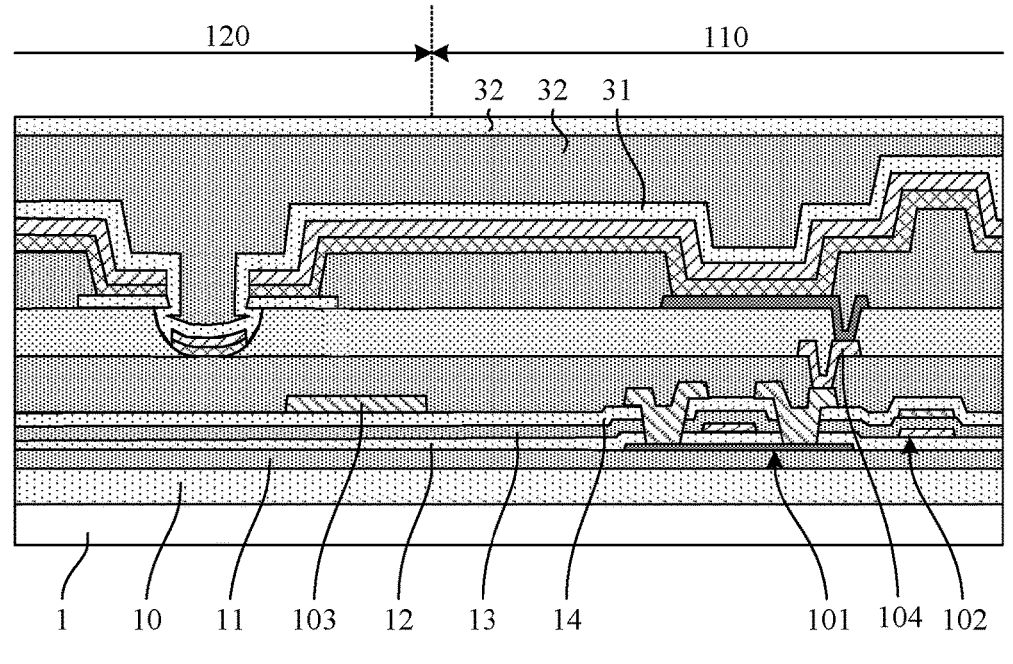
FIGS. 21*a* and 21*b* are schematic diagrams after a pattern of a third encapsulation layer is formed according to an exemplary embodiment of the present disclosure.
Figure 21B:
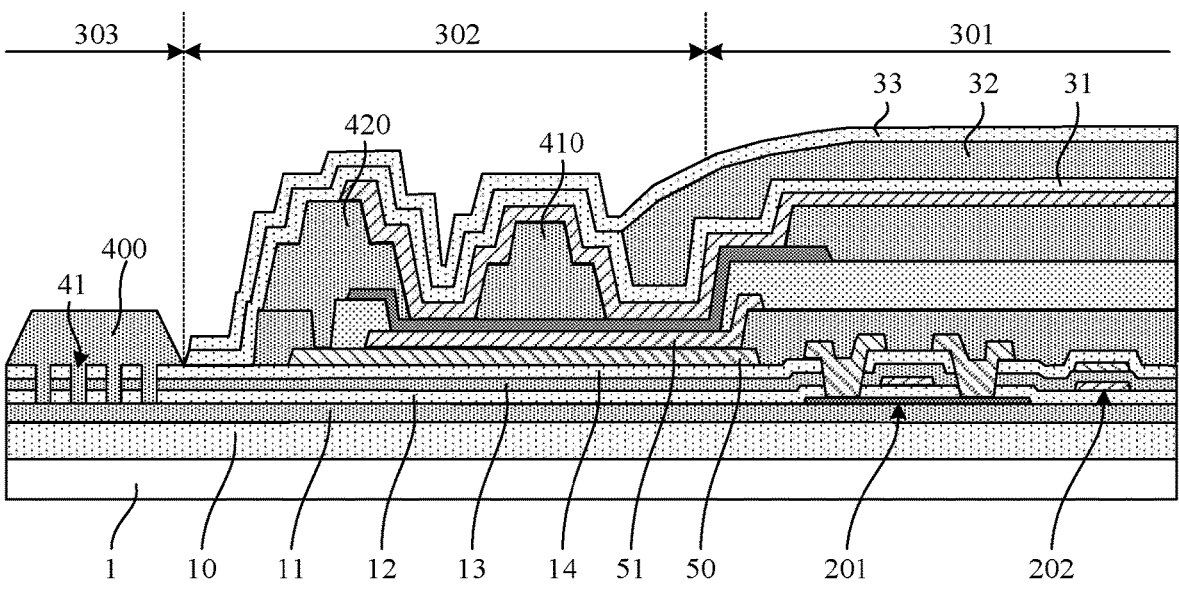

(13) Forming a pattern of a third encapsulation layer. In an exemplary implementation mode, forming the pattern of the third encapsulation layer may include: depositing a third encapsulation thin film by means of deposition using an open mask on the base substrate on which the above-mentioned patterns are formed to form a pattern of a third encapsulation layer 33, as shown in FIGS. 21a and 21b.

In an exemplary implementation mode, the third encapsulation layer 33 may be located in the display region, and the circuit area 301 and the isolation dam area 302 of the bezel region. The third encapsulation layer 33 of the pixel area 110 and the pin area 120 is disposed on the second encapsulation layer 32, on a side of the first isolation dam 410 close to the display region in the circuit area 301 and the isolation dam area 302, the third encapsulation layer 33 is disposed on the second encapsulation layer 32, and in other regions of the isolation dam area 302, the third encapsulation layer 33 is disposed on the first encapsulation layer 31 wrapping the first isolation dam 410 and the second isolation dam 420.

In an exemplary embodiment, the first encapsulation layer and the third encapsulation layer may be made of any one or more of following: Silicon Oxide (SiOx), Silicon Nitride (SiNx), and Silicon Oxynitride (SiON), and may be a single layer, a multi-layer, or a composite layer, which may ensure that external water and oxygen cannot enter the light emitting structure layer. The second encapsulation layer may be made of an organic material, such as a resin, playing a role of covering each film layer of the display substrate so as to improve structural stability and flatness.

Hereto, a pattern of the encapsulation structure layer is formed. In the display region and the circuit area of the bezel region, the encapsulation structure layer includes the first encapsulation layer, the second encapsulation layer, and the third encapsulation layer that are stacked, and a laminated structure of an inorganic material/an organic material/an inorganic material is formed. In the isolation dam area of the bezel region, the encapsulation structure layer includes the first encapsulation layer and the third encapsulation layer that are stacked, and a laminated structure of an inorganic material/an inorganic material is formed, which may further ensure encapsulation integrity and effectively isolate external water and oxygen.

In an exemplary implementation mode, after preparation of the encapsulation layer is completed, a touch structure layer (TSP) may be formed on an encapsulation layer, and the touch structure layer may include a touch electrode layer, or include a touch electrode layer and a touch insulation layer, which is not limited in the present disclosure.

In an exemplary implementation mode, during preparation of a flexible display substrate, a preparation process of the display substrate may further include processes such as stripping a base substrate, attaching a back film, and cutting, which is not limited in the present disclosure.

As may be seen from the structure of the display substrate and the preparation process thereof in the exemplary embodiment of the present disclosure, in the exemplary embodiment of the present disclosure, the pin area with the pin structure is provided in the display region, and the pin structure is completely wrapped by the first encapsulation layer, so that the partition groove forms a pin point for the encapsulation layer, thereby enhancing the ability of the film layers to resist shear stress and effectively preventing peeling failure of the film layers. The pin structure of the exemplary embodiment of the present disclosure includes the partition groove and the partition layer with the "eave" structure, the organic light emitting layer and the cathode are disconnected at the "eave" structure. The first encapsulation layer wraps the partition layer and the inner wall of the partition groove, so that a structure in which the cathode and the organic light emitting layer are sandwiched by two inorganic layers near the pin point is formed, which not only increases adhesion of the organic light emitting layer, but also enhances the ability of the film layers to resist shear stress, avoids peeling between film layers to a maximum extent, avoids encapsulation failure, and improves product quality and service life. The preparation process of the display substrate in the exemplary embodiment of the present disclosure has good process compatibility, simple process achievement, easy implementation, a high production efficiency, a low production cost, and a high yield.

The structure of the display substrate and the preparation process thereof in the exemplary embodiment of the present disclosure are merely illustrative. In an exemplary implementation mode, a corresponding structure may be changed and a patterning process may be increased or decreased according to actual needs, which is not limited in the present disclosure.

Figure 22:
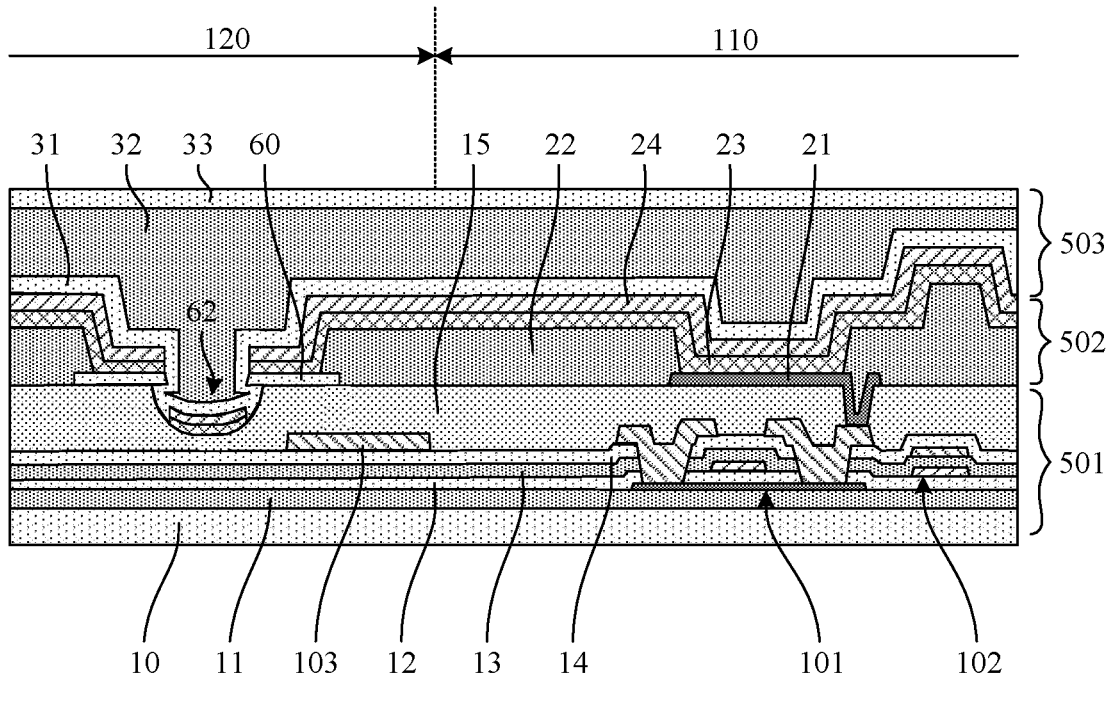
FIG. 22 is a schematic diagram of a structure of another display substrate according to an exemplary embodiment of the present disclosure.

FIG. 22 is a schematic diagram of a structure of another display substrate according to an exemplary embodiment of the present disclosure, and is a cross-sectional view taken along a direction A-A in FIG. 7. A main body structure of the display substrate of this exemplary embodiment is substantially the same as a structure of a dual source and drain metal layer (2SD) shown in FIG. 9A, a difference is that the display substrate of this exemplary embodiment is of a single source and drain metal layer (1SD), as shown in FIG. 22.

In an exemplary implementation mode, a pixel area 110 may include a driving structure layer 501 disposed on a base substrate 10, a light emitting structure layer 502 disposed on a side of the driving structure layer 501 away from the base substrate, and an encapsulation structure layer 503 disposed on a side of the light emitting structure layer 502 away from the base substrate.

In an exemplary implementation mode, a pin area 120 may include: a composite insulation layer disposed on the base substrate 10, a signal lead 103 provided on a side of the composite insulation layer away from the base substrate, a first planarization layer 15 covering the signal lead 103 and a partition layer 60 disposed on a side of the first planarization layer 15 away from the base substrate. The partition layer 60 is provided with a partition hole, a partition groove 62 is provided on the first planarization layer 15, the partition hole and the partition groove 62 communicate with each other, and the partition layer 60, the partition hole, and the partition groove 62 form a pin structure. The pin area 120 may further include: a pixel definition layer 22 covering an outer edge of the partition layer 60 away from the partition hole, an organic light emitting layer 23 and a cathode 24 provided on a side of the partition layer 60 and the pixel definition layer 22 away from the base substrate, an organic light emitting block and a cathode block provided on a bottom of the partition groove 61, a first encapsulation layer 31 wrapping the pin structure, a second encapsulation layer 32 provided on a side of the first encapsulation layer 31 away from the base substrate, and a third encapsulation layer 33 provided on a side of the second encapsulation layer 32 away from the base substrate.

In the exemplary embodiment of the present disclosure, the pin structure is provided in a display region, and the pin structure is completely wrapped by the first encapsulation layer, so that the partition groove forms a pin point for an encapsulation layer, thereby also enhancing an ability of film layers to resist shear stress and effectively preventing peeling failure of the film layers.

Figure 23:
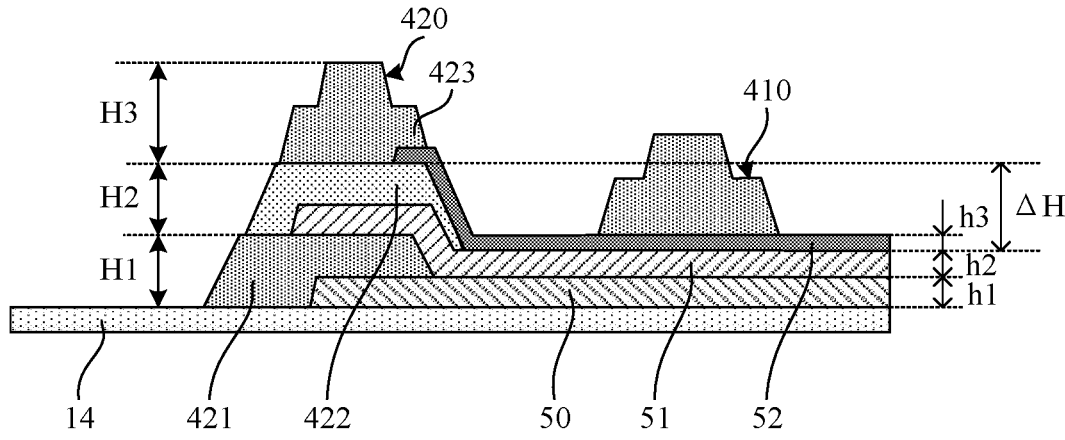
FIG. 23 is a schematic diagram of a structure of an isolation dam area of a display substrate.

In a display substrate, there is not only a problem of encapsulation failure of a display region due to peeling between film layers, but also there is a problem of encapsulation failure of an isolation dam area of a bezel region due to edge peeling of a conductive layer. It is found by researches that the edge peeling of the conductive layer in the isolation dam area is caused by over-etching of the conductive layer, and the over-etching of the conductive layer is caused by a relatively high height of a second isolation dam. FIG. 23 is a schematic diagram of a structure of an isolation dam area of a display substrate. As shown in FIG. 23, a second isolation dam 420 of the isolation dam area is composes of multiple organic material layers and multiple conductive layer wrappings. A first planarization dam foundation 421 disposed in a same layer as a first planarization layer covers an edge of a side of a power supply line 50 away from a display region. A side of a first connection electrode 51 away from the display region is lapped on the first planarization dam foundation 421. A second planarization dam foundation 422 disposed in a same layer as a second planarization layer is disposed on the first planarization dam foundation 421, and covers an edge of the side of the first connection electrode 51 away from the display region. A side of a second connection electrode 52 away from the display region provided in a same layer as an anode is lapped on the second planarization dam foundation 422. A third planarization dam foundation 423 provided in a same layer as a pixel definition layer is provided on the second planarization dam foundation 422 and covers an edge of the side of the second connection electrode 52 away from the display region. As may be seen from the structure shown in FIG. 23, with respect to a surface of a fourth insulation layer 14, a height of a first isolation dam 410 is $h1+h2+h3+H3$, a height of a second isolation dam 420 is $H1+H2+H3$, and a segment difference $\Delta H$ between the side of the second connection electrode 52 away from the display region and a side of the second connection electrode 52 close to the display region is about $(H1+H2)-(h1+h2+h3)$. Among them, H1 is a thickness of the first planarization dam foundation 421, H2 is a thickness of the second planarization dam foundation 422, H3 is a thickness of the third planarization dam foundation 423, h1 is a thickness of the power supply line 50, h2 is a thickness of the first connection electrode 51, and h3 is a thickness of the second connection electrode 52. Since thicknesses of the first planarization layer and the second planarization layer of an organic material are relatively thick, and thicknesses of the power supply line and the second connection electrode of a metal material are relatively thin, the height of the second isolation dam 420 and the segment difference $\Delta H$ of the second connection electrode 52 are relatively large. With introduction of an opening in a screen (an Active Area (AA) Hole) and other requirements, dry etching will be carried out in other regions in a subsequent process. Although a part that does not need to be etched in a dry etching process will be blocked by using photoresist (PR), However, when the height of the second isolation dam 420 is too high and the segment difference of the second connection electrode 52 is relatively large, photoresist in a region where the second isolation dam 420 is located is too thin to effectively protect a film layer structure, resulting in over-etching of the second connection electrode 52 during dry etching, which causes a damage to the second connection electrode 52 (segment difference portion) lapped on a side wall of the second planarization dam foundation 422, results in edge peeling, and further leads to encapsulation failure.

Figure 24:
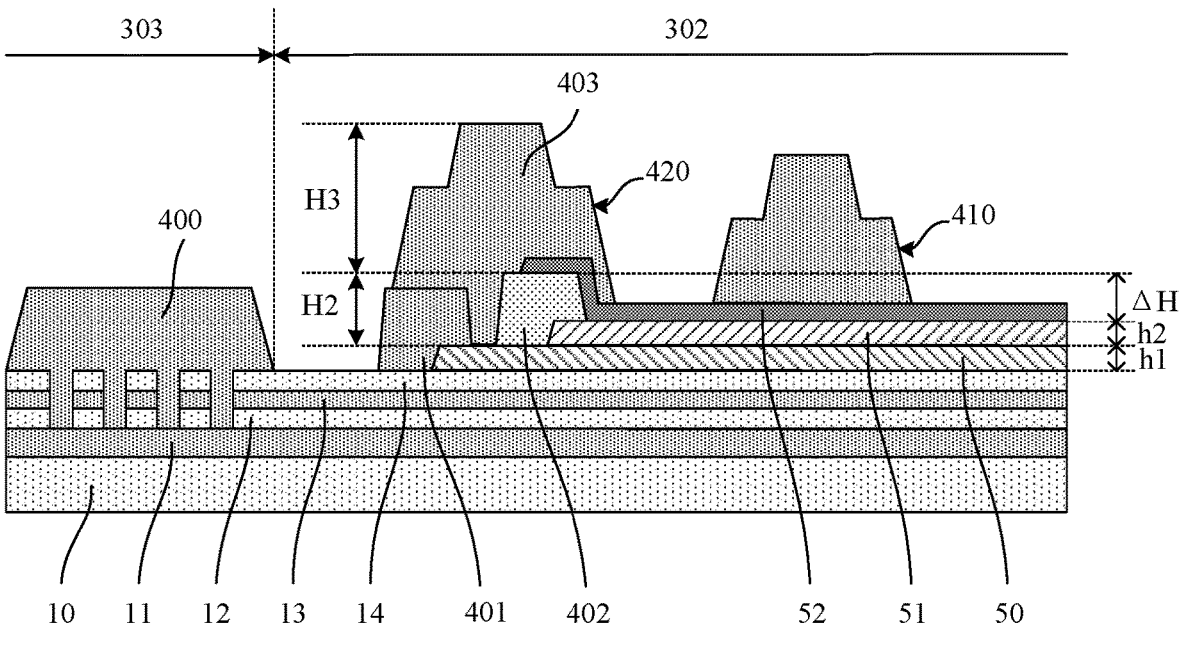
FIG. 24 is a schematic diagram of a structure of an isolation dam area according to an exemplary embodiment of the present disclosure.

FIG. 24 is a schematic diagram of a structure of an isolation dam area according to an exemplary embodiment of the present disclosure, and is an enlarged view of the isolation dam area and the crack dam area in FIG. 16*b*. As shown in FIG. 24, the second isolation dam 420 of the isolation dam area may include a first dam foundation 401, a second dam foundation 402, a third dam foundation 403 and wrapped edges of three conductive layers.

In an exemplary implementation mode, the power supply line 50 is disposed in the isolation dam area 302, and the first dam foundation 401 disposed in a same layer as the first planarization layer covers an edge of a side of the power supply line 50 away from the display region, and an orthographic projection of the edge of the side of the power supply line 50 away from the display region on the base substrate is within a range of an orthographic projection of the first dam foundation 401 on the base substrate. The first connection electrode 51 is provided in the isolation dam area 302 and lapped on the power supply line 50, but an edge of a side of the first connection electrode 51 away from the display region is indented towards a direction of the display region with respect to the edge of the side of the power supply line 50 away from the display region. The second dam foundation 402 disposed in a same layer as the second planarization layer and the first dam foundation 401 are arranged side by side, and an orthographic projection of the second dam foundation 402 on the base substrate is not overlapped with the orthographic projection of the first dam foundation 401 on the base substrate. The second dam foundation 402 is disposed on the power supply line 50 and covers the edge of the side of the first connection electrode 51 away from the display region, and an orthographic projection of the edge of the side of the first connection electrode 51 on the base substrate is within a range of the orthographic projection of the second dam foundation 402 on the base substrate. The second connection electrode 52 provided in a same layer as the anode is provided in the isolation dam area 302, a side close to the display region is lapped on the first connection electrode 51, and a side away from the display region is lapped on the second dam foundation 402. The third dam foundation 403 provided in a same layer as the pixel definition layer is provided on the first dam foundation 401 and the second dam foundation 402, and covers an edge of a side of the second connection electrode 52 away from the display region, and an orthographic projection of the edge of the side of the second connection electrode 52 away from the display region on the base substrate is within a range of an orthographic projection of the third dam foundation 403 on the base substrate.

In an exemplary implementation mode, an orthographic projection of an edge of a side of the power supply line 50 away from the display region on the base substrate may be within a range of an orthographic projection of the third dam foundation 403 on the base substrate. An orthographic projection of an edge of a side of the first connection electrode 51 away from the display region on the base substrate may be within a range of the orthographic projection of the third dam foundation 403 on the base substrate. The orthographic projection of the third dam foundation 403 on the base substrate is at least partially overlapped with an orthographic projection of the first dam foundation 401 on the base substrate, and the orthographic projection of the third dam foundation 403 on the base substrate is at least partially overlapped with an orthographic projection of the second dam foundation 402 on the base substrate.

As may be seen from the structure shown in FIG. 24, with respect to a surface of the fourth insulation layer 14, a height of the second isolation dam 420 is h1+H2+H3, and a segment difference ΔH between a side of the second connection electrode 52 away from the display region and a side of the second connection electrode 52 close to the display region is about H2–h2, wherein H2 is a thickness of the second dam foundation 402, H3 is a thickness of the third dam foundation 403, h1 is a thickness of the power supply line 50, and h2 is a thickness of the first connection electrode 51. In this exemplary implementation mode, two dam foundations arranged side by side are used for covering edges of the power supply line 50 and the first connection electrode 51 respectively, not only the height of the second isolation dam 420 is reduced, but also the segment difference ΔH of the second connection electrode 52 is reduced, thus avoiding over-etching of the second connection electrode 52 in subsequent dry etching and avoiding edge peeling.

In this exemplary implementation mode, the edge of the side of the power supply line 50 away from the display region is covered by the first dam foundation 401, the edge of the side of the first connection electrode 51 away from the display region is covered by the second dam foundation 402, and the edge of the side of the second connection electrode 52 away from the display region is covered by the third dam foundation 403, so that edges of multiple conductive layers form multiple wrappings, which may effectively prevent peeling failure of edges of conductive layers.

Figure 25:
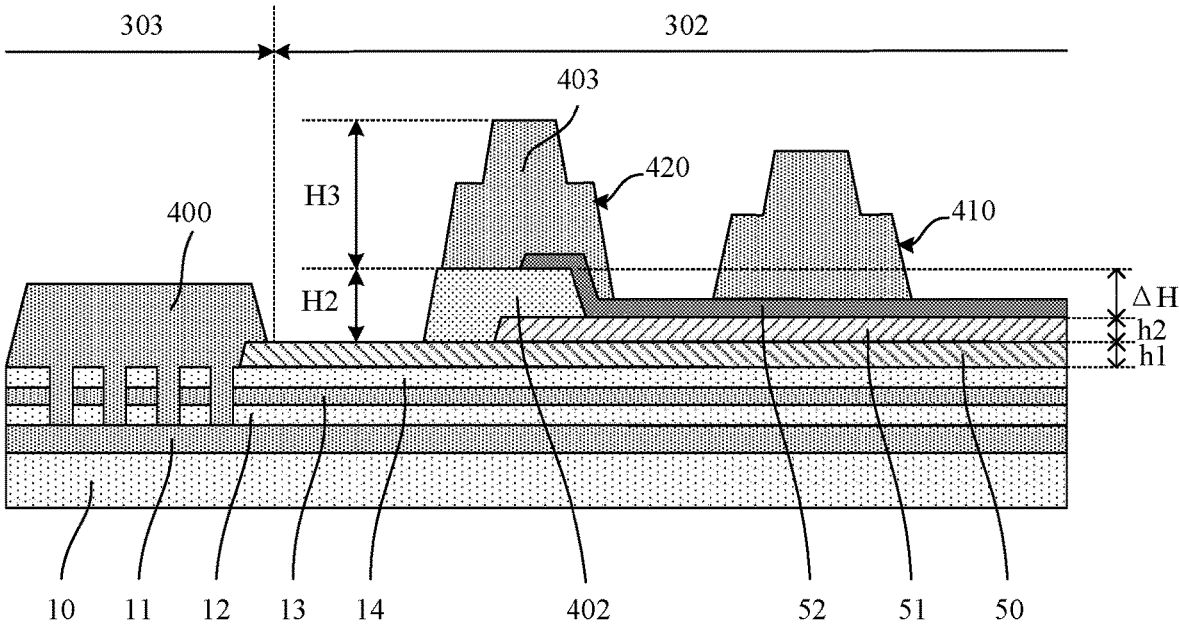
FIG. 25 is a schematic diagram of a structure of another isolation dam area according to an exemplary embodiment of the present disclosure.

FIG. 25 is a schematic diagram of a structure of another isolation dam area according to an exemplary embodiment of the present disclosure. As shown in FIG. 25, the second isolation dam 420 of the isolation dam area may include the second dam foundation 402, the third dam foundation 403, and wrapped edges of two conductive layers.

In an exemplary implementation mode, the power supply line 50 is disposed in the isolation dam area 302 and the crack dam area 303, and the crack dam 400 disposed in a same layer as the first planarization layer covers the edge of the side of the power supply line 50 away from the display region, and the orthographic projection of the edge of the side of the power supply line 50 away from the display region on the base substrate is within a range of an orthographic projection of the crack dam 400 on the base substrate. The first connection electrode 51 is provided in the isolation dam area 302 and lapped on the power supply line 50. The second dam foundation 402 provided in a same layer as the second planarization layer is disposed on the power supply line 50 and covers the edge of the side of the first connection electrode 51 away from the display region, and the orthographic projection of the edge of the side of the first connection electrode 51 on the base substrate is within a range of the orthographic projection of the second dam foundation 402 on the base substrate. The second connection electrode 52 provided in a same layer as the anode is disposed in the isolation dam area 302, a side close to the display region is lapped on the first connection electrode 51, and a side away from the display region is lapped on the second dam foundation 402. The orthographic projection of the edge of the side of the second connection electrode 52 away from the display region on the base substrate is within a range of the orthographic projection of the second dam foundation 402 on the base substrate. The third dam foundation 403 provided in a same layer as the pixel definition layer is provided on the second dam foundation 402 and covers the edge of the side of the second connection electrode 52 away from the display region, and the orthographic projection of the edge of the side of the second connection electrode 52 away from the display region on the base substrate is within a range of the orthographic projection of the third dam foundation 403 on the base substrate.

As may be seen from the structure shown in FIG. 25, with respect to a surface of the fourth insulation layer 14, a height of the second isolation dam 420 is h1+H2+H3, and a segment difference ΔH between the side of the second connection electrode 52 away from the display region and the side of the second connection electrode 52 close to the display region is about H2–h2.

In this exemplary embodiment, the power supply line 50 extends to the crack dam area 303, the isolation dam area 302 only needs to be provided with the second dam foundation 402 and the third dam foundation 403 covering edges of the first connection electrode 51 and the second connection electrode 52, respectively. Therefore, the second isolation dam 420 does not include the first dam foundation 401, which not only reduces the height of the second isolation dam 420, but also reduces the segment difference ΔH of the second connection electrode 52, avoids over-etching of the second connection electrode 52 in subsequent dry etching, and avoids edge peeling.

In this exemplary embodiment, the edge of the side of the power supply line 50 away from the display region is covered by the crack dam 400, the edge of the side of the first connection electrode 51 away from the display region is covered by the second dam foundation 402, and the edge of the side of the second connection electrode 52 away from the display region is covered by the third dam foundation 403, which may effectively prevent peeling failure of edges of conductive layers.

In this exemplary embodiment, the power supply line 50 extends to the crack dam area, so that a resistance of the power supply line 50 may be effectively reduced and a resistance voltage drop of the power supply line 50 may be effectively reduced.

Figure 26:
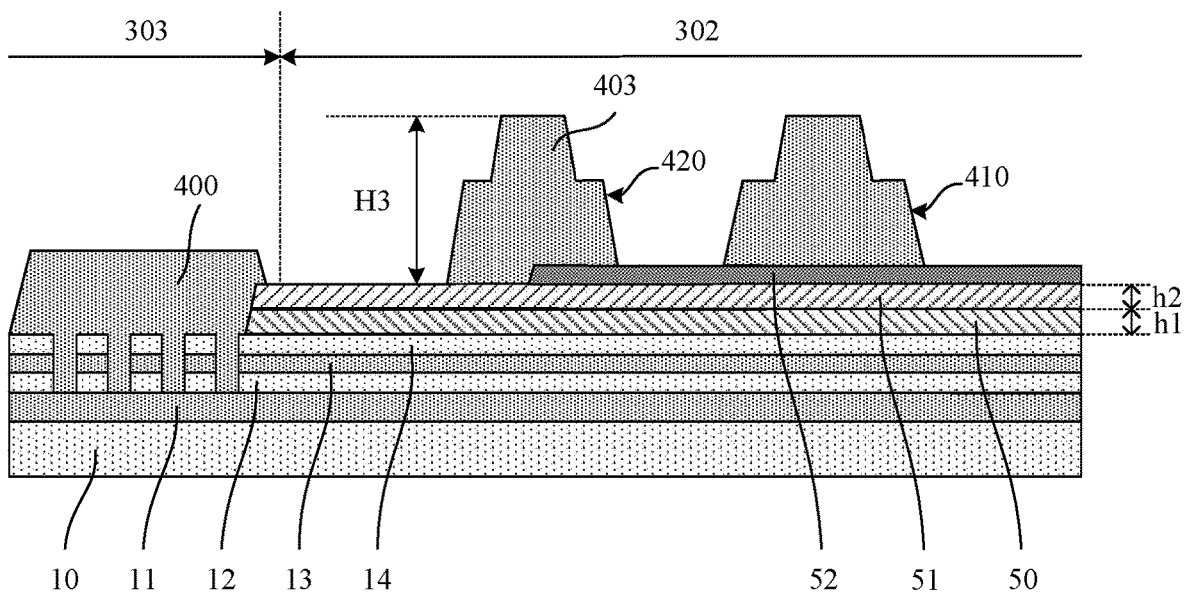
FIG. 26 is a schematic diagram of a structure of another isolation dam area according to an exemplary embodiment of the present disclosure.

FIG. 26 is a schematic diagram of a structure of another isolation dam area according to an exemplary embodiment of the present disclosure. As shown in FIG. 26, the second isolation dam 420 of the isolation dam area may include the third dam foundation 403 and a wrapped edge of one conductive layer.

In an exemplary implementation mode, the power supply line 50 is provided in the isolation dam area 302 and the crack dam area 303, the first connection electrode 51 is also provided in the isolation dam area 302 and the crack dam area 303, and is lapped on the power supply line 50. The crack dam 400 provided in a same layer as the first planarization layer simultaneously covers the edge of the side of the power supply line 50 away from the display region and the edge of the side of the first connection electrode 51 away from the display region, wherein orthographic projections of the edge of the side of the power supply line 50 away from the display region and the edge of the side of the first connection electrode 51 away from the display region on the base substrate are within a range of an orthographic projection of the crack dam 400 on the base substrate. The second connection electrode 52 provided in a same layer as the anode is disposed in the isolation dam area 302 and is lapped on the first connection electrode 51. The third dam foundation 403 provided in a same layer as the pixel definition layer is provided on the second connection electrode 52 and covers the edge of the side of the second connection electrode 52 away from the display region, and an orthographic projection of the edge of the side of the second connection electrode 52 away from the display region on the base substrate is within a range of an orthographic projection of the third dam foundation 403 on the base substrate.

As may be seen from the structure shown in FIG. 26, with respect to a surface of the fourth insulation layer 14, a height of the second isolation dam 420 is h1+H2+H3, and is substantially the same as a height of the first isolation dam 410, and the second connection electrode 52 has no segment difference, that is, a segment difference ΔH between the side of the second connection electrode 52 away from the display region and the side of the second connection electrode 52 close to the display region is about 0.

In this exemplary embodiment, the power supply line 50 and the first connection electrode 51 extend to the crack dam area 303, the isolation dam area 302 only needs to be provided with the third dam foundation 403 covering the edge of the second connection electrode 52. Therefore, the second isolation dam 420 does not include the first dam foundation 401 or the second dam foundation 402, which not only reduces the height of the second isolation dam 420, but also reduces the segment difference ΔH of the second connection electrode 52 to a maximum extent, avoids over-etching of the second connection electrode 52 in subsequent dry etching, and avoids edge peeling.

In this exemplary embodiment, the edge of the side of the power supply line 50 away from the display region and the edge of the side of the first connection electrode 51 away from the display region are covered by the crack dam 400, and the edge of the side of the second connection electrode 52 away from the display region is covered by the third dam foundation 403, which may effectively prevent peeling failure of an edge of a conductive layer.

In this exemplary embodiment, the power supply line 50 and the first connection electrode 51 extend to the crack dam area, so that resistances of the power supply line 50 and the first connection electrode 51 may be effectively reduced, and resistance voltage drops of the power supply line 50 and the first connection electrode 51 may be effectively reduced.

Figure 27:
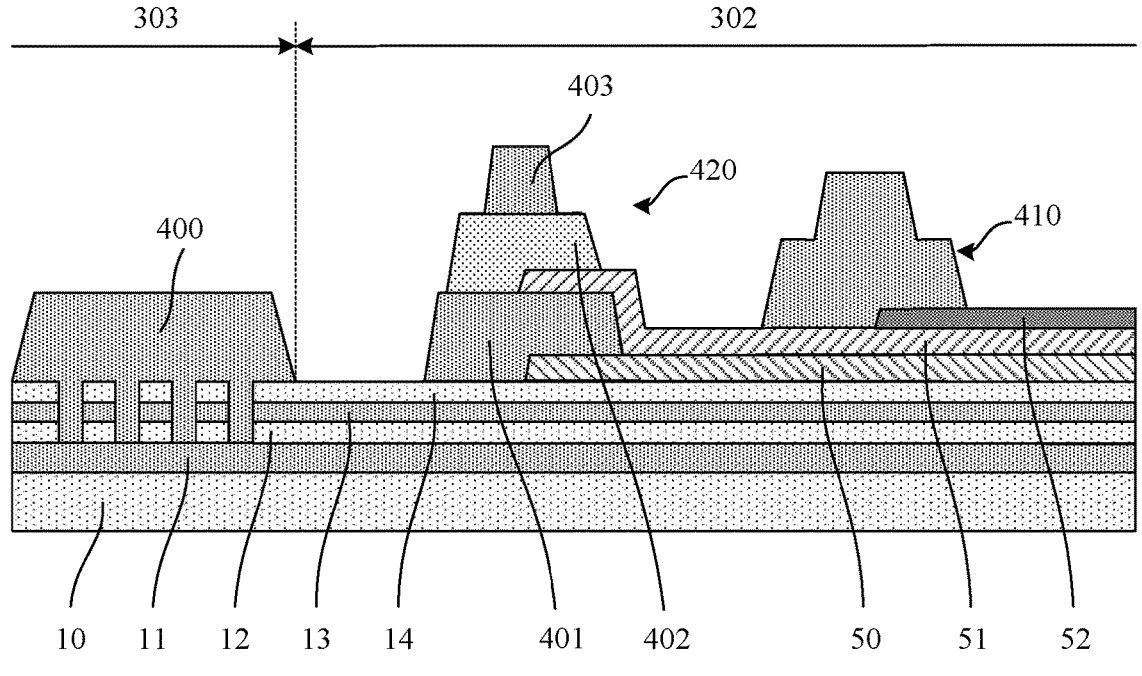
FIG. 27 is a schematic diagram of a structure of another isolation dam area according to an exemplary embodiment of the present disclosure.

FIG. 27 is a schematic diagram of a structure of another isolation dam area according to an exemplary embodiment of the present disclosure. As shown in FIG. 27, the second isolation dam 420 of the isolation dam area may include the first dam foundation 401, the second dam foundation 402, the third dam foundation 403, and wrapped edges of two conductive layers.

In an exemplary implementation mode, the power supply line 50 is disposed in the isolation dam area 302, and the first dam foundation 401 disposed in a same layer as the first planarization layer covers an edge of a side of the power supply line 50 away from the display region, and an orthographic projection of the edge of the side of the power supply line 50 away from the display region on the base substrate is within a range of an orthographic projection of the first dam foundation 401 on the base substrate. The first connection electrode 51 is provided in the isolation dam area 302, a side close to the display region is lapped on the power supply line 50, and a side away from the display region is lapped on the first dam foundation 401. An orthographic projection of an edge of a side of the first connection electrode 51 away from the display region on the base substrate is within a range of an orthographic projection of the first dam foundation 401 on the base substrate. The second dam foundation 402 provided in a same layer as the second planarization layer is disposed on the first dam foundation 401 and covers the edge of the side of the first connection electrode 51 away from the display region, and an orthographic projection of the edge of the side of the first connection electrode 51 on the base substrate is within a range of an orthographic projection of the second dam foundation 402 on the base substrate. The second connection electrode 52 disposed in a same layer as the anode is disposed in the isolation dam area 302 and is lapped on the first connection electrode 51. However the edge of the side of the second connection electrode 52 away from the display region is indented towards the display region with respect to the edge of the side of the power supply line 50 away from the display region, and an orthographic projection of the second connection electrode 52 on the base substrate is not overlapped with orthographic projections of the first dam foundation 401 and the second dam foundation 402 on the base substrate. The third dam foundation 403 is disposed on the second dam foundation 402. The first isolation dam 410 provided in a same layer as the pixel definition layer is provided on the first connection electrode 51 and covers the edge of the side of the second connection electrode 52 away from the display region. An orthographic projection of the edge of the side of the second connection electrode 52 on the base substrate is within a range of an orthographic projection of the first isolation dam 410 on the base substrate. In an exemplary implementation mode, the third dam foundation 403 may be disposed in a same layer as a post spacer in the display region.

As may be seen from the structure shown in FIG. 27, although a height of the second isolation dam 420 is relatively high, the second connection electrode 52 has no segment difference, that is, a segment difference ΔH between the side of the second connection electrode 52 away from the display region and the side of the second connection electrode 52 close to the display region is about 0.

In this exemplary embodiment, the segment difference ΔH of the second connection electrode 52 is reduced by covering the edge of the side of the second connection electrode 52 away from the display region using the first isolation dam 410, which avoids over-etching of the second connection electrode 52 in subsequent dry etching, and avoids edge peeling.

In this exemplary embodiment, the edge of the side of the power supply line 50 away from the display region is covered by the first dam foundation 401, the edge of the side of the first connection electrode 51 away from the display region is covered by the second dam foundation 402, and the edge of the side of the second connection electrode 52 away from the display region is covered by the first isolation dam foundation 410, which may effectively prevent peeling failure of edges of conductive layers.

Figure 28:
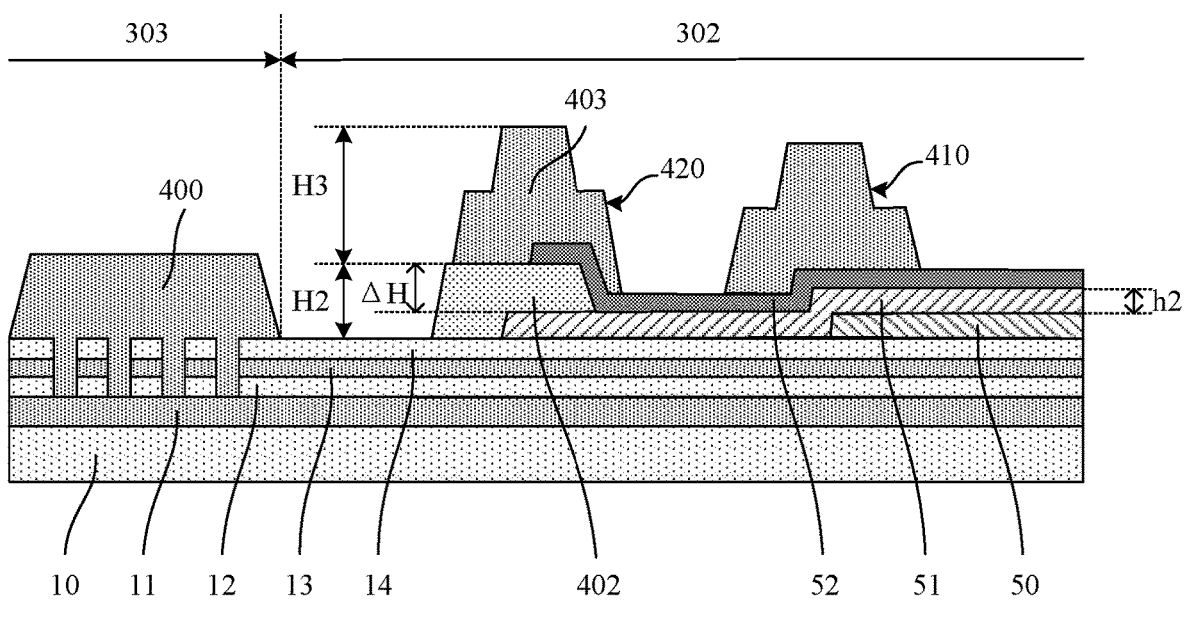
FIG. 28 is a schematic diagram of a structure of another isolation dam area according to an exemplary embodiment of the present disclosure.

FIG. 28 is a schematic diagram of a structure of another isolation dam area according to an exemplary embodiment of the present disclosure. As shown in FIG. 28, the second isolation dam 420 of the isolation dam area may include the second dam foundation 402, the third dam foundation 403, and wrapped edges of two conductive layers.

In an exemplary implementation mode, the power supply line 50 and the first connection electrode 51 are provided in the isolation dam area 302, but with respect to the edge of the side of the first connection electrode 51 away from the display region, the edge of the side of the power supply line 50 away from the display region is indented towards the display region, so that the side of the first connection electrode 51 close to the display region is lapped on the power supply line 50, the side of the first connection electrode 51 away from the display region is lapped on the fourth insulation layer 14, and the edge of the side of the power supply line 50 away from the display region is covered by the first connection electrode 51, and an orthographic projection of the edge of the side of the power supply line 50 away from the display region on the base substrate is within a range of an orthographic projection of the first connection electrode 51 on the base substrate. The second dam foundation 402 provided in a same layer as the second planarization layer is disposed on the fourth insulation layer 14 and covers the edge of the side of the first connection electrode 51 away from the display region, and an orthographic projection of the edge of the side of the first connection electrode 51 away from the display region on the base substrate is within a range of an orthographic projection of the second dam foundation 402 on the base substrate. The second connection electrode 52 provided in a same layer as the anode is disposed in the isolation dam area 302, a side close to the display region is lapped on the first connection electrode 51, and a side away from the display region is lapped on the second dam foundation 402. An orthographic projection of the edge of the side of the second connection electrode 52 away from the display region on the base substrate is within a range of the orthographic projection of the second dam foundation 402 on the base substrate. The third dam foundation 403 provided in a same layer as the pixel definition layer is provided on the second dam foundation 402 and covers the edge of the side of the second connection electrode 52 away from the display region, and the orthographic projection of the edge of the side of the second connection electrode 52 away from the display region on the base substrate is within a range of an orthographic projection of the third dam foundation 403 on the base substrate.

In an exemplary implementation mode, an orthographic projection of the edge of the side of the power supply line 50 away from the display region on the base substrate may be within a range of an orthographic projection of the first isolation dam 410 on the base substrate.

As may be seen from the structure shown in FIG. 28, with respect to a surface of the fourth insulation layer 14, a height of the second isolation dam 420 is H2+H3, and a maximum segment difference ΔH of the second connection electrode 52 is about H2−h2.

In this exemplary embodiment, the power supply line 50 is indented towards the display region, the isolation dam area 302 only needs to be provided with the second dam foundation 402 and the third dam foundation 403 covering edges of the first connection electrode 51 and the second connection electrode 52, respectively. Therefore, the second isolation dam 420 does not include the first dam foundation 401, which not only reduces the height of the second isolation dam 420, but also reduces the segment difference ΔH of the second connection electrode 52, avoids over-etching of the second connection electrode 52 in subsequent dry etching, and avoids edge peeling.

In this exemplary embodiment, the edge of the side of the power supply line 50 away from the display region is covered by the first connection electrode 51, the edge of the side of the first connection electrode 51 away from the display region is covered by the second dam foundation 402, and the edge of the side of the second connection electrode 52 away from the display region is covered by the third dam foundation 403, which may effectively prevent peeling failure of edges of conductive layers.

Figure 29:
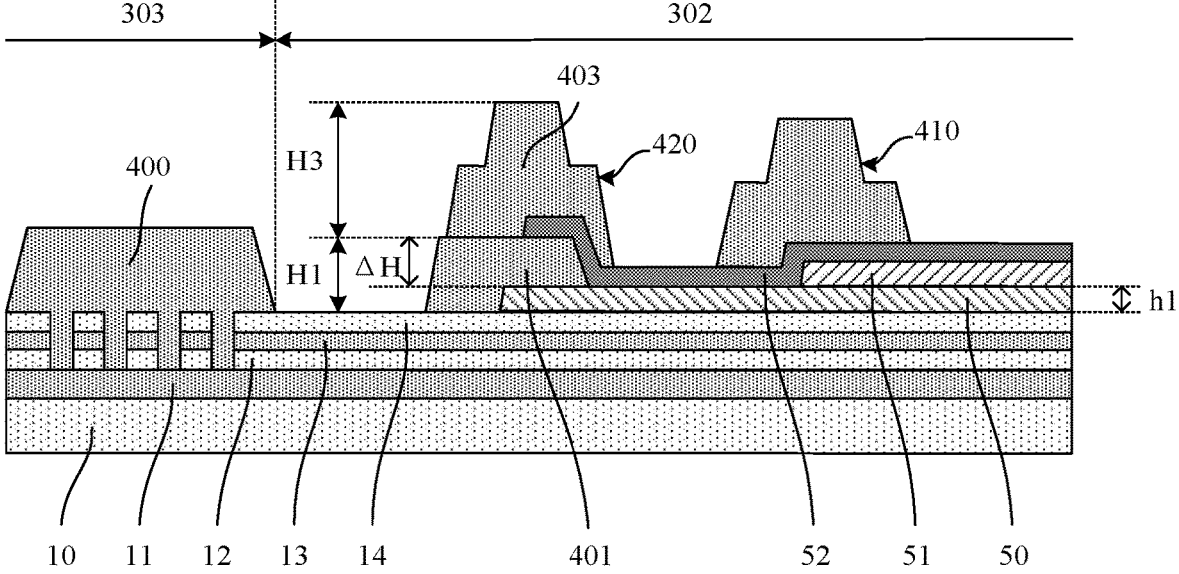
FIG. 29 is a schematic diagram of a structure of another isolation dam area according to an exemplary embodiment of the present disclosure.

FIG. 29 is a schematic diagram of a structure of another isolation dam area according to an exemplary embodiment of the present disclosure. As shown in FIG. 29, the second isolation dam 420 of the isolation dam area may include the first dam foundation 401, the third dam foundation 403, and wrapped edges of two conductive layers.

In an exemplary implementation mode, the power supply line 50 is disposed in the isolation dam area 302, and the first dam foundation 401 disposed in a same layer as the first planarization layer covers an edge of a side of the power supply line 50 away from the display region, and an orthographic projection of the edge of the side of the power supply line 50 away from the display region on the base substrate is within a range of an orthographic projection of the first dam foundation 401 on the base substrate. The first connection electrode 51 is provided in the isolation dam area 302 and is lapped on the power supply line 50, but an edge of a side of the first connection electrode 51 away from the display region is indented towards the display region with respect to the edge of the side of the power supply line 50 away from the display region, and an orthographic projection of the first connection electrode 51 on the base substrate is not overlapped with the orthographic projection of the first dam foundation 401 on the base substrate. The second connection electrode 52 is disposed in the isolation dam area 302, a side of the second connection electrode 52 close to the display region is lapped on the first connection electrode 51, a side of the second connection electrode 52 away from the display region is lapped on the first dam foundation 401, and an orthographic projection of the edge of the side of the second connection electrode 52 away from the display region on the base substrate is within a range of the orthographic projection of the first dam foundation 401 on the base substrate. A middle region of the second connection electrode 52 is lapped on the power supply line 50 such that the edge of the side of the first connection electrode 51 away from the display region is covered by the second connection electrode 52, and the orthographic projection of the edge of the side of the first connection electrode 51 away from the display region on the base substrate is within a range of an orthographic projection of the second connection electrode 52 on the base substrate. The third dam foundation 403 provided in a same layer as the pixel definition layer is provided on the first dam foundation 401 and covers the edge of the side of the second connection electrode 52 away from the display region, and the orthographic projection of the edge of the side of the second connection electrode 52 away from the display region on the base substrate is within a range of an orthographic projection of the third dam foundation 403 on the base substrate.

In an exemplary implementation mode, the orthographic projection of the edge of the side of the first connection electrode 51 away from the display region on the base substrate may be within a range of an orthographic projection of the first isolation dam 410 on the base substrate.

As may be seen from the structure shown in FIG. 29, with respect to a surface of the fourth insulation layer 14, a height of the second isolation dam 420 is H1+H3, a maximum segment difference ΔH of the second connection electrode 52 is about H1-h1, and H1 is a thickness of the first dam foundation 401.

In this exemplary embodiment, the first connection electrode 51 is indented towards the display region, the isolation dam area 302 only needs to be provided with the first dam foundation 401 and the third dam foundation 403 covering edges of the power supply line 50 and the second connection electrode 52, respectively. Therefore, the second isolation dam 420 does not include the second dam foundation 402, which not only reduces the height of the second isolation dam 420, but also reduces the segment difference ΔH of the second connection electrode 52, avoids over-etching of the second connection electrode 52 in subsequent dry etching, and avoids edge peeling.

In this exemplary embodiment, the edge of the side of the power supply line 50 away from the display region is covered by the first dam foundation 401, the edge of the side of the first connection electrode 51 away from the display region is covered by the second connection electrode 52, and the edge of the side of the second connection electrode 52 away from the display region is covered by the third dam foundation 403, which may effectively prevent peeling failure of edges of conductive layers.

In an exemplary implementation mode, in the structures shown in FIGS. 24 to 29, a width of the first isolation dam may be about 30 μm to 100 μm, and a width of the second isolation dam may be about 30 μm to 100 μm, in the second isolation dam, a width of the first dam foundation, the second dam foundation, or the third dam foundation covering the edge of the power supply line, the edge of the first connection electrode, or the edge of the second connection electrode may be greater than 3 μm, wherein the width is a dimension along a direction away from the display region. A thickness H1 of the first dam foundation may be about 1 μm to 3 μm, a thickness H2 of the second dam foundation may be about 1 μm to 3 μm, and a thickness H3 of the third dam foundation may be about 1 μm to 3 μm, wherein a thickness is a dimension along a direction perpendicular to the base substrate. A minimum spacing between the first dam foundation and the second dam foundation arranged at intervals may be greater than 3 μm, a minimum spacing between the first isolation dam and the second isolation dam arranged at intervals may be greater than 3 μm, and a minimum spacing between the second isolation dam and the crack dam arranged at intervals may be greater than 3 μm.

In an exemplary implementation mode, in the structures shown in FIGS. 24 to 29, structures of the edge of the side of the power supply line close to the display region, the edge of the side of the first connection electrode close to the display region, and the edge of the side of the second connection electrode close to the display region may be the same as those shown in FIG. 9b, or an alternate arrangement of various edges may be adjusted accordingly, which is not limited in the present disclosure.

As may be seen from the structure of the display substrate of the exemplary embodiment of the present disclosure, in the exemplary embodiment of the present disclosure, by a staggered structure of various conductive layers and an alternate arrangement of edges of various conductive layers in the isolation dam area, not only the height of the second isolation dam is reduced, the segment difference of the second connection electrode is reduced, which avoids over-etching of the second connection electrode in subsequent dry etching, avoids a damage to the second connection electrode, avoids edge peeling, and makes edges of multiple conductive layers form multiple wrappings, so that peeling failure of edges of conductive layers may be further prevented, structural reliability is improved, and product quality and service life are improved.

In an exemplary implementation mode, the display substrate of the present disclosure may be applied to a display apparatus with a pixel drive circuit, such as an OLED, a quantum dot display (QLED), a light emitting diode display (Micro LED or Mini LED) or a quantum dot light emitting diode display (QDLED), which is not limited in the present disclosure.

The present disclosure further provides a preparation method of a display substrate for preparing the aforementioned display substrates. In an exemplary implementation mode, the display substrate may include a display region, the display region may include at least one pin area, and the preparation method may include: forming a planarization layer and a partition layer disposed on the planarization layer sequentially on a base substrate, wherein a partition hole is provided on the partition layer, a partition groove is provided on the planarization layer, the partition groove is communicated with the partition hole, the partition layer located at a periphery of the partition hole is provided with a protruding part relative to a side wall of the partition groove, and the protruding part and the side wall of the partition groove form an inwardly recessed structure; and forming an encapsulation structure layer that covers the protruding part and the side wall and a groove bottom of the partition groove.

The present disclosure further provides a display apparatus including the display substrate of the aforementioned embodiments. The display apparatus may be any product or component with a display function, such as a mobile phone, a tablet computer, a television, a display, a laptop computer, a digital photo frame, or a navigator.

Although the implementation modes disclosed in the present disclosure are as above, the described contents are only implementation modes used for convenience of understanding the present disclosure and are not intended to limit the present disclosure. Any person skilled in the art to which the present disclosure pertains may make any modifications and variations in forms and details of implementations without departing from the spirit and the scope disclosed in the present disclosure, but the patent protection scope of the present disclosure shall still be subject to the scope defined by the appended claims.

The invention claimed is:

1. A display substrate, comprising a display region, wherein the display region comprises at least one pin area, in a plane perpendicular to the display substrate, the pin area comprises a planarization layer disposed on a base substrate, a partition layer disposed on a side of the planarization layer away from the base substrate, and an encapsulation structure layer disposed on a side of the partition layer away from the base substrate; a pin structure is provided on the planarization layer and the partition layer, and the encapsulation structure layer covers the pin structure, wherein a partition groove is provided on the planarization layer, and a partition hole is provided on the partition layer, the partition layer is a flat structure except for the partition hole, the pin area further comprises a pixel definition layer disposed on the side of the partition layer away from the base substrate, the pixel definition layer only covers an outer edge of the partition layer away from the partition hole, such that an orthographic projection of the outer edge on the base substrate is within a range of an orthographic projection of the pixel definition layer on the base substrate;

wherein the display substrate further comprises a bezel region located on at least one side of the display region, the bezel region comprises an isolation dam area and a crack dam area disposed sequentially along a direction away from the display region; in a plane perpendicular to the base substrate, the isolation dam area comprises a composite insulation layer disposed on the base substrate, a power supply line disposed on a side of the composite insulation layer away from the base substrate, a first connection electrode disposed on a side of the power supply line away from the base substrate, a second connection electrode disposed on a side of the first connection electrode away from the base substrate, and a first isolation dam and a second isolation dam which are disposed on a side of the second connection electrode away from the base substrate, the second isolation dam is disposed on a side of the first isolation dam away from the display region; the crack dam area comprises the composite insulation layer disposed on the base substrate and a crack dam disposed on a side of the composite insulation layer away from the base substrate, multiple cracks are provided on the composite insulation layer, and the crack dam fills the multiple cracks; and wherein an edge of a side of the power supply line away from the display region, an edge of a side of the first connection electrode away from the display region, and an edge of a side of the second connection electrode away from the display region are covered by the first isolation dam and/or the second isolation dam and are not in contact with the encapsulation structure layer.

2. The display substrate according to claim 1, wherein the partition groove is communicated with the partition hole, the partition layer located at a periphery of the partition hole has a protruding part relative to a side wall of the partition groove, the protruding part and the side wall of the partition groove form an inwardly recessed structure, and the encapsulation structure layer covers the protruding part, and the side wall and a groove bottom of the partition groove.

3. The display substrate according to claim 2, wherein the pixel definition layer is provided with a partition opening that exposes the partition hole and the partition groove, and the encapsulation structure layer covers the partition opening.

4. The display substrate according to claim 2, wherein the encapsulation structure layer comprises a first encapsulation layer of an inorganic material, a second encapsulation layer of an organic material, and a third encapsulation layer of an inorganic material, the first encapsulation layer covers the protruding part and the side wall and the groove bottom of the partition groove, the second encapsulation layer is disposed on a side of the first encapsulation layer away from the base substrate and fills the partition groove, and the third encapsulation layer is disposed on a side of the second encapsulation layer away from the base substrate.

5. The display substrate according to claim 2, wherein the planarization layer comprises a first planarization layer, the partition layer is disposed on a side of the first planarization layer away from the base substrate, and the partition groove is provided on the first planarization layer.

6. The display substrate according to claim 2, wherein the pin area further comprises: an organic light emitting layer disposed on the side of the partition layer away from the base substrate, a cathode disposed on a side of the organic light emitting layer away from the base substrate, an organic light emitting block disposed at the groove bottom of the partition groove, and a cathode block disposed on a side of the organic light emitting block away from the base substrate, the organic light emitting layer and the organic light emitting block are disposed to be isolated from each other, the cathode and the cathode block are disposed to be isolated from each other, and the encapsulation structure layer covers the cathode on the partition layer and the cathode block at the groove bottom of the partition groove.

7. The display substrate according to claim 2, wherein the planarization layer comprises a first planarization layer and a second planarization layer disposed on a side of the first planarization layer away from the base substrate, the partition layer is disposed on a side of the second planarization layer away from the base substrate, and the partition groove is provided on the second planarization layer.

* * * * *